(12) United States Patent
Mizuta

(10) Patent No.: US 9,673,792 B2
(45) Date of Patent: Jun. 6, 2017

(54) DRIVE CIRCUIT

(71) Applicant: Renesas Electronics Corporation, Kawasaki-shi (JP)

(72) Inventor: Asaki Mizuta, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/622,618

(22) Filed: Feb. 13, 2015

(65) Prior Publication Data

US 2015/0244335 A1    Aug. 27, 2015

(30) Foreign Application Priority Data

Feb. 21, 2014   (JP) ................................ 2014-031371

(51) Int. Cl.

| H03B 1/00 | (2006.01) |
|---|---|
| H03K 3/00 | (2006.01) |
| H03K 5/01 | (2006.01) |
| H03F 3/21 | (2006.01) |
| H03F 3/45 | (2006.01) |
| H03K 5/00 | (2006.01) |

(52) U.S. Cl.
CPC ............... *H03K 5/01* (2013.01); *H03F 3/211* (2013.01); *H03F 3/45475* (2013.01); *H03F 2200/129* (2013.01); *H03F 2203/45116* (2013.01); *H03F 2203/45138* (2013.01); *H03K 2005/00286* (2013.01)

(58) Field of Classification Search
CPC ....... H03F 3/45076; H03K 3/015; H03K 5/01
USPC ..... 327/108–112, 427, 434, 437, 52, 54, 56, 327/178, 240, 306, 308, 315, 316; 326/82, 83, 87
See application file for complete search history.

(56) References Cited

U.S. PATENT DOCUMENTS

| 6,812,740 B2 | 11/2004 | Oda | |
|---|---|---|---|
| 2005/0151569 A1* | 7/2005 | Osamura | ............... H03F 1/0272 327/108 |

FOREIGN PATENT DOCUMENTS

| JP | 2003-204231 A | 7/2003 |
|---|---|---|
| JP | 2013-012868 A | 1/2013 |

* cited by examiner

*Primary Examiner* — Lincoln Donovan
*Assistant Examiner* — Thomas Skibinski
(74) *Attorney, Agent, or Firm* — McGinn IP Law Group, PLLC

(57) ABSTRACT

A drive circuit includes a signal source that outputs an AC signal, a voltage generator circuit that includes a differential amplifier that generates a first AC voltage with a constant amplitude from the AC signal and outputs the first AC voltage to one end of an external load, and a voltage-to-current converter circuit that is connected to another end of the external load and supplies an AC current with a constant amplitude in opposite phase to the first AC voltage to the external load in accordance with the AC signal.

6 Claims, 31 Drawing Sheets

DRIVE CIRCUIT

CROSS-REFERENCE TO RELATED APPLICATIONS

This application is based upon and claims the benefit of priority from Japanese patent application No. 2014-031371, filed on Feb. 21, 2014, the disclosure of which is incorporated herein in its entirety by reference.

BACKGROUND

The present invention relates to a drive circuit and, for example, to a drive circuit that drives a load connected thereto.

A drive circuit for driving an external load connected thereto is mounted on various electric equipment, semiconductor devices and the like.

For example, a drive circuit to be used for bioelectrical impedance measurement is proposed (Japanese Unexamined Patent Application Publication No. 2013-12868). A living body is electrically connected as a load to this drive circuit. In this configuration, the drive circuit passes an alternating current (AC) with a constant amplitude through the living body and thereby can measure the impedance of the living body. In this example, an output terminal of a differential amplifier in the drive circuit is connected to one end of the living body, and the other end of the living body is connected to an inverting input terminal of the differential amplifier, thereby forming a feedback circuit.

Besides, a drive circuit that passes a constant current through a load (coil) is proposed (Japanese Unexamined Patent Application Publication No. 2003-204231). This drive circuit passes a current through the load by varying an output voltage with respect to a fixed voltage.

SUMMARY

However, the present inventor has found that the above-described drive circuits have the following problems. The drive circuit disclosed in Japanese Unexamined Patent Application Publication No. 2013-12868 has a negative feedback circuit using a differential amplifier. Thus, the operation of the differential amplifier becomes unstable depending on the impedance of the load connected to the differential amplifier. It is therefore difficult to cope with loads having various impedance levels.

The other problems and novel features of the present invention will become apparent from the description of the specification and the accompanying drawings.

According to one embodiment, a drive circuit includes a signal source that outputs an AC signal, a voltage generator circuit that includes a differential amplifier that generates a first AC voltage with a constant amplitude from the AC signal and outputs the first AC voltage to one end of an external load, and a voltage-to-current converter circuit that is connected to another end of the external load and supplies an AC current with a constant amplitude in opposite phase to the first AC voltage to the external load.

According to one embodiment, a drive circuit includes a signal source that outputs an AC signal, a voltage generator circuit that outputs a first AC voltage with a constant amplitude to one end of an external load, and a voltage-to-current converter circuit that is connected to another end of the external load and supplies an AC current with a constant amplitude in opposite phase to the first AC voltage to the external load.

According to the above-described embodiment, it is possible to pass a current with a constant amplitude to a load without depending on the impedance of the load.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

The preferred embodiments of the present invention will be described hereinafter in detail with reference to the drawings. It is noted that in the description of the drawings the same elements will be denoted by the same reference symbols and redundant description will be omitted.

First Embodiment

Figure 1:
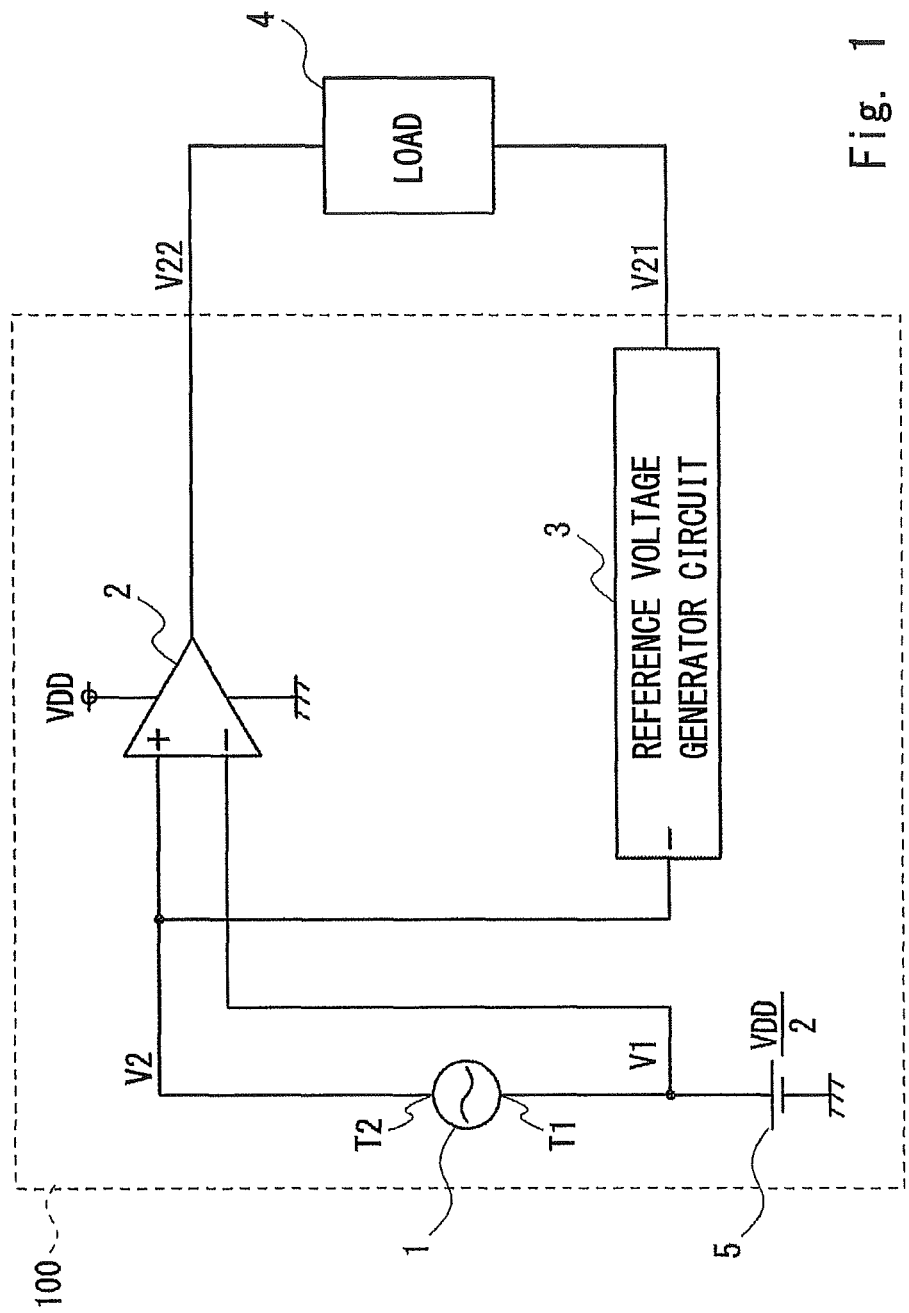
FIG. 1 is a circuit block diagram showing a configuration of a drive circuit according to a first embodiment.

A drive circuit 100 according to a first embodiment is described hereinafter. FIG. 1 is a circuit block diagram showing a configuration of the drive circuit 100 according to the first embodiment. The drive circuit 100 includes an AC voltage signal source 1, a voltage-to-current converter circuit 2, and a reference voltage generator circuit 3. Note that the AC voltage signal source is also referred to simply as a signal source. The reference voltage generator circuit is also referred to as a voltage generator circuit.

The AC voltage signal source 1 outputs an AC voltage. One terminal T2 of the AC voltage signal source 1 is connected to a positive phase input terminal of the voltage-to-current converter circuit 2, and the other terminal T1 is connected to a negative phase input terminal of the voltage-to-current converter circuit 2. Further, a DC power supply 5 that outputs a DC voltage V1 (which is also referred to as a specified voltage) with a level of VDD/2 is inserted between the terminal T1 of the AC voltage signal source 1 and the ground. A high-voltage terminal of the DC power supply 5 is connected to the terminal T1 of the AC voltage signal source 1, and a low-voltage terminal is connected to the ground. In this example, a voltage output from the terminal T1 is a DC voltage V1, and a voltage output from the terminal T2 is an AC signal V2.

The voltage-to-current converter circuit 2 is a circuit that outputs a current signal proportional to (i.e. a current signal in phase with) the input AC signal V2 to a load 4. The positive phase input terminal of the voltage-to-current converter circuit 2 is connected to the terminal T2 of the AC voltage signal source 1. The negative phase input terminal of the voltage-to-current converter circuit 2 is connected to the terminal T1 of the AC voltage signal source 1 and the high-voltage terminal of the DC power supply 5. The output terminal of the voltage-to-current converter circuit 2 is connected to one end of the load 4. Because the voltage-to-current converter circuit 2 outputs a current signal that is in phase with the AC signal V2, an output voltage V22 (which is also referred to as a first AC voltage) of the voltage-to-current converter circuit 2 is in phase with the AC voltage V2. Note that the voltage-to-current converter circuit 2 is inserted between the power supply voltage VDD and the ground and thereby receives power supply.

The reference voltage generator circuit 3 generates a reference voltage V21 (which is also referred to as a second AC voltage) for feeding a current to the load 4. The reference voltage generator circuit 3 is configured as an inverting amplifier in this example. The AC signal V2 is input to an input terminal of the reference voltage generator circuit 3. An output terminal of the reference voltage generator circuit 3 is connected to the other end of the load 4. The reference voltage generator circuit 3 is inserted between the power supply voltage VDD and the ground and thereby receives power supply.

In this example, the AC signal V2 is input to the positive phase input terminal of the voltage-to-current converter circuit 2, and the DC voltage V1 is input to the negative phase input terminal of the voltage-to-current converter circuit 2. The AC signal V2 is input to the input terminal of the reference voltage generator circuit 3. As a result, the reference voltage V21 that is output from the reference voltage generator circuit 3 is an AC voltage that is in opposite phase to the output voltage V22 of the voltage-to-current converter circuit 2.

Note that the reference voltage generator circuit may be configured as a non-inverting amplifier, and an AC signal that is in opposite phase to the AC signal V2 may be input to the input terminal of the reference voltage generator circuit. Further, the reference voltage generator circuit may have another configuration as long as it can output a reference voltage in opposite phase to the output voltage of the voltage-to-current converter circuit.

In the drive circuit 100 having the above-described configuration, when the amplitude of the AC signal V2 output from the AC voltage signal source 1 is positive, the amplitude of the reference voltage V21 is negative, and the amplitude of the output voltage V22 is positive. In this case, a current that flows from the voltage-to-current converter circuit 2 through the load 4 to the reference voltage generator circuit 3 passes through the load 4. Further, in the voltage-to-current converter circuit 2, when the amplitude of the AC signal V2 output from the AC voltage signal source 1 is negative, the amplitude of the reference voltage V21 is positive, and the amplitude of the output voltage V22 is negative. In this case, a current that flows from the reference voltage generator circuit 3 through the load 4 to the voltage-to-current converter circuit 2 passes through the load 4. Accordingly, a current proportional to the AC signal V2 flows through the load 4.

Figure 2:
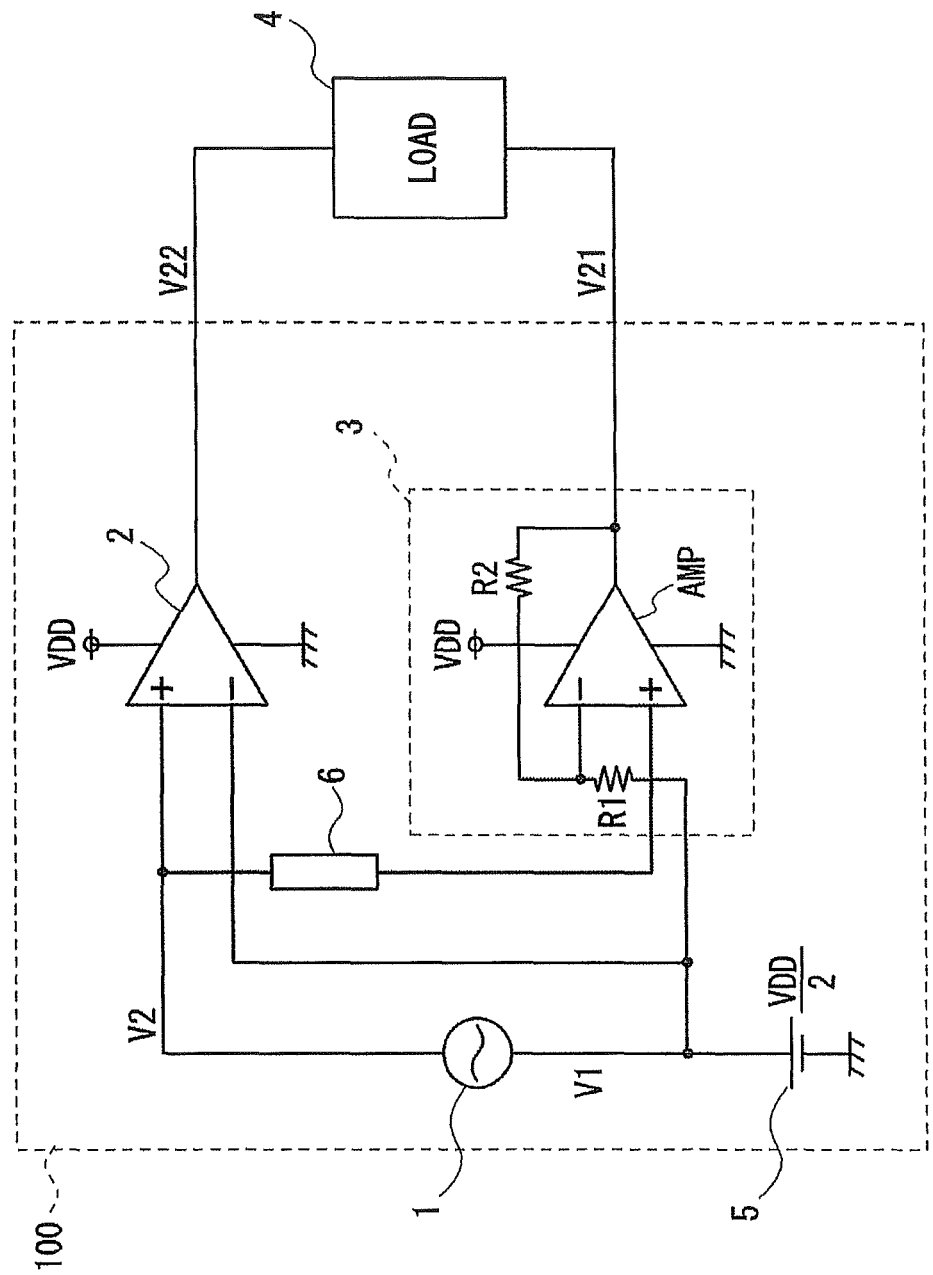
FIG. 2 is a circuit diagram showing a configuration of a drive circuit according to the first embodiment.

Next, a configuration of the reference voltage generator circuit 3 is described hereinafter. FIG. 2 is a circuit diagram showing a configuration of the drive circuit 100 according to the first embodiment. In this example, the reference voltage generator circuit 3 is composed of a resistor R1 (which is also referred to as a first resistor), a resistor R2 (which is also referred to as a second resistor) and a differential amplifier AMP. In this example, a phase adjuster 6 is inserted between the reference voltage generator circuit 3 and the AC voltage signal source 1. Note that the phase adjuster 6 is not an essential element.

The non-inverting input terminal of the differential amplifier AMP is connected to the terminal T2 of the AC voltage signal source 1 and the positive phase input terminal of the voltage-to-current converter circuit 2 through the phase adjuster 6. The inverting input terminal of the differential amplifier AMP is connected to the terminal T1 of the AC voltage signal source 1 and the high-voltage terminal of the DC power supply 5 through the resistor R1. Further, the inverting input terminal of the differential amplifier AMP is connected to the output terminal of the differential amplifier AMP through the resistor R2.

A specific example of the operation of the drive circuit 100 is described hereinafter. The AC voltage signal source 1 receives power supply with VDD/2 and outputs an AC sinusoidal signal with a frequency of f=50 kHz and an amplitude of A=1V. If VDD=2.4V, the AC signal V2 is the AC sinusoidal signal that varies in the range of 1.2V±1.0V.

Hereinafter, the resistances of the resistor R1 and the resistor R2 are denoted as R1 and R2, respectively. If R1=10 kΩ and R2=9 kΩ, the reference voltage V21 is represented by the following equation (1). In the subsequence equations, t indicates time.

[Equation 1]

$$V21 = -\frac{R2}{R1} \cdot A \cdot \sin(2\pi f t) + 1.2 \quad (1)$$
$$= -0.9\sin(10^5 \pi t) + 1.2$$

If the resistance of the load 4 is RT=2.5 kΩ and the amplitude of the output current I of the voltage-to-current converter circuit 2 is 800 mA, the output voltage V22 of the voltage-to-current converter circuit 2 is represented by the following equation (2).

[Equation 2]

$$V22 = RT \cdot I \cdot \sin(2\pi f t) + V21 \quad (2)$$
$$= 2\sin(10^5 \pi t) - 0.9\sin(10^5 \pi t) + 1.2$$
$$= 1.1\sin(10^5 \pi t) + 1.2$$

Figure 3:
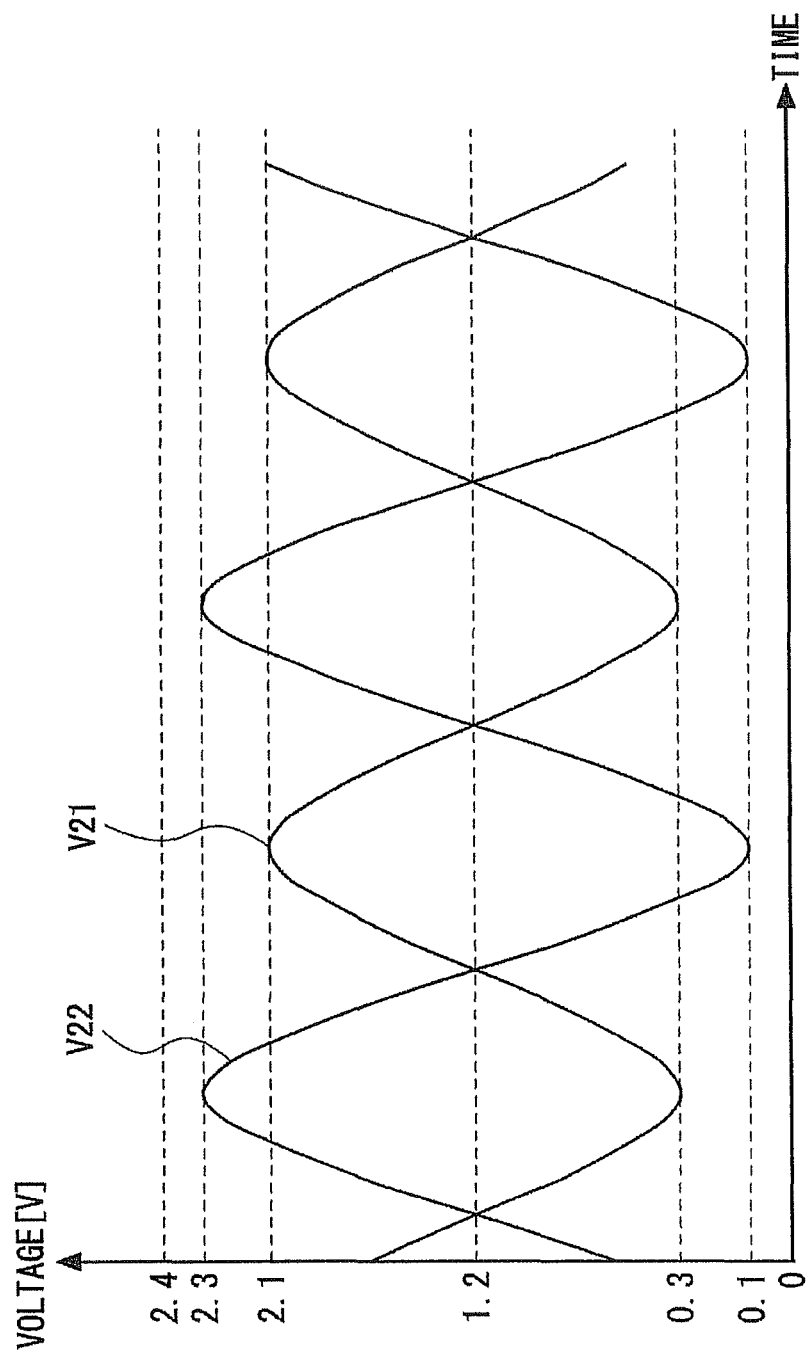
FIG. 3 is a graph showing a relationship between a reference voltage and an output voltage in a drive circuit 100 according to the first embodiment.

FIG. 3 is a graph showing a relationship between the reference voltage V21 and the output voltage V22 in the drive circuit 100 according to the first embodiment. As shown in FIG. 3, the reference voltage V21 varies in the range of +0.3V to +2.1V and the output voltage V22 varies in the range of +0.1V to +2.3V.

Figure 4:
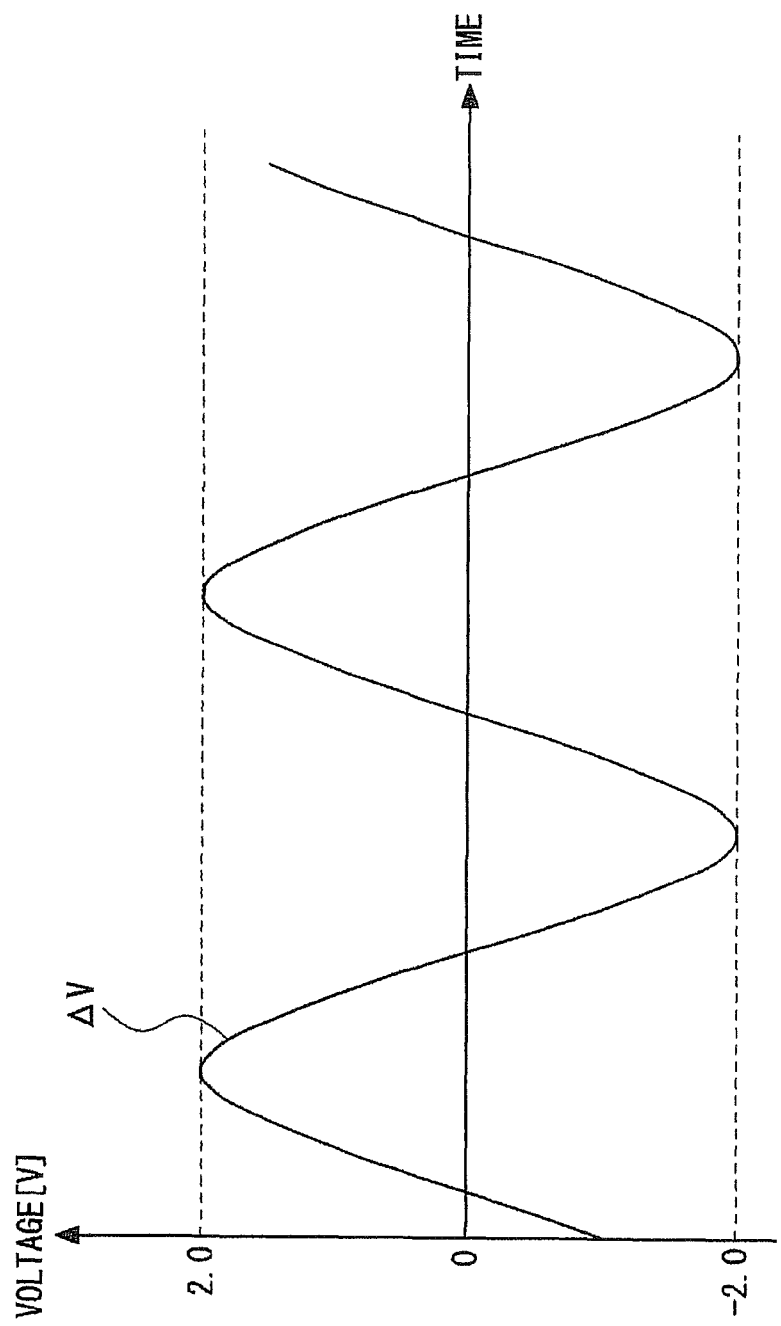
FIG. 4 is a graph showing a differential voltage between an output voltage and a reference voltage in a drive circuit according to the first embodiment.

FIG. 4 is a graph showing a differential voltage between the output voltage V22 and the reference voltage V21 in the drive circuit 100 according to the first embodiment. Because the output voltage V22 and the reference voltage V21 are in opposite phase to each other, a differential voltage ΔV between the output voltage V22 and the reference voltage V21, which serves as a drive voltage for passing a current through the load 4, can vary in the range of −2.0V to +2.0V. Accordingly, in the drive circuit 100, the both amplitude levels (4.0 Vp-p in this example) of the voltage applied to the load can be increased to be higher than the power supply voltage VDD (+2.4V).

Figure 5:
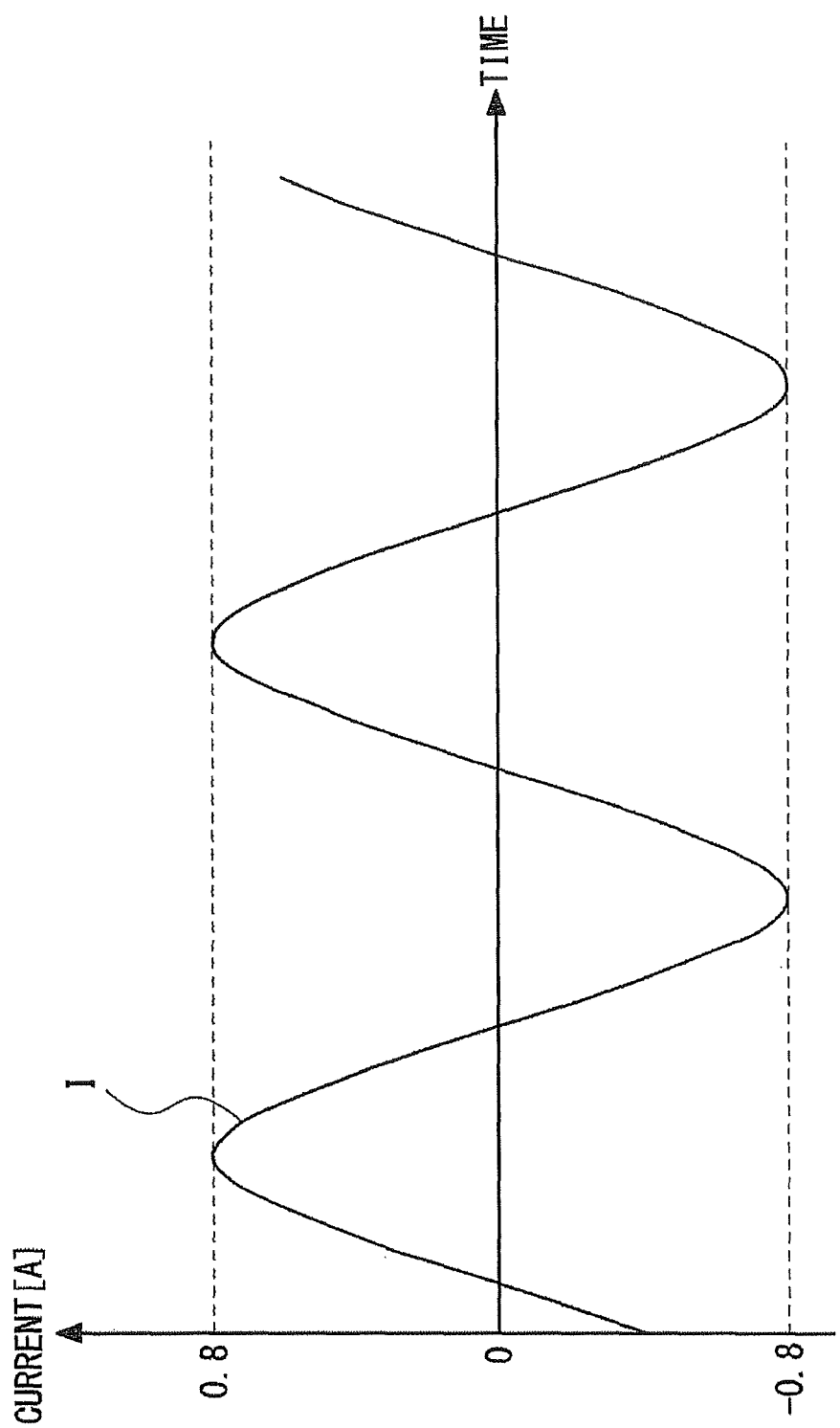
FIG. 5 is a graph showing a current flowing through a load by a drive circuit according to the first embodiment.

FIG. 5 is a graph showing a current flowing through a load by the drive circuit 100 according to the first embodiment. Because the drive circuit 100 can increase the amplitude of the voltage applied to the load, the current flowing through the load can be high (amplitude of 800 μA) even at a low power supply voltage.

Figure 6:
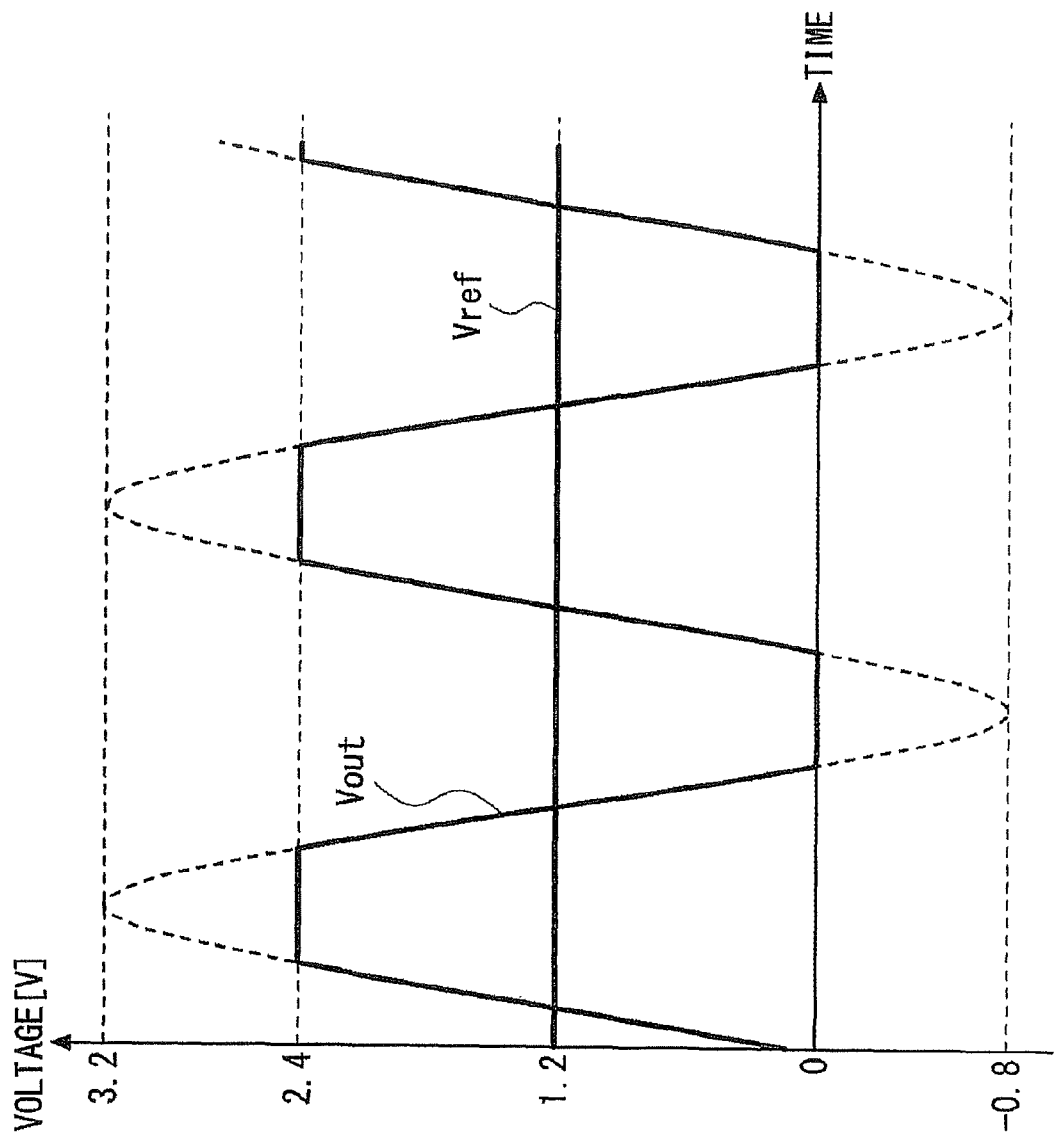
FIG. 6 is a graph showing an example of an output voltage of a voltage-to-current converter circuit when a reference voltage is constant.

As a comparative example, the case where the reference voltage is constant (eg. Japanese Unexamined Patent Application Publication No. 2003-204231) is described. It is assumed that the reference voltage is +1.2V, which is ½ of the power supply voltage (+2.4V), for example. FIG. 6 is a graph showing an example of the output voltage of the voltage-to-current converter circuit when the reference voltage is constant. In this case, if the amplitude of the voltage applied to the load is 2.0V, which is the same as in the drive circuit 100, the output voltage Vout of the voltage-to-current converter circuit needs to vary in the range of −0.8V to +3.2V with respect to the reference voltage Vref (the dashed line in FIG. 6). However, the output voltage Vout of the voltage-to-current converter circuit cannot be higher than the power supply voltage (+2.4V) and lower than the ground (0V). Therefore, the output voltage Vout is a waveform where the top of a sinusoidal wave is cut as shown by the solid line in FIG. 6.

Figure 7:
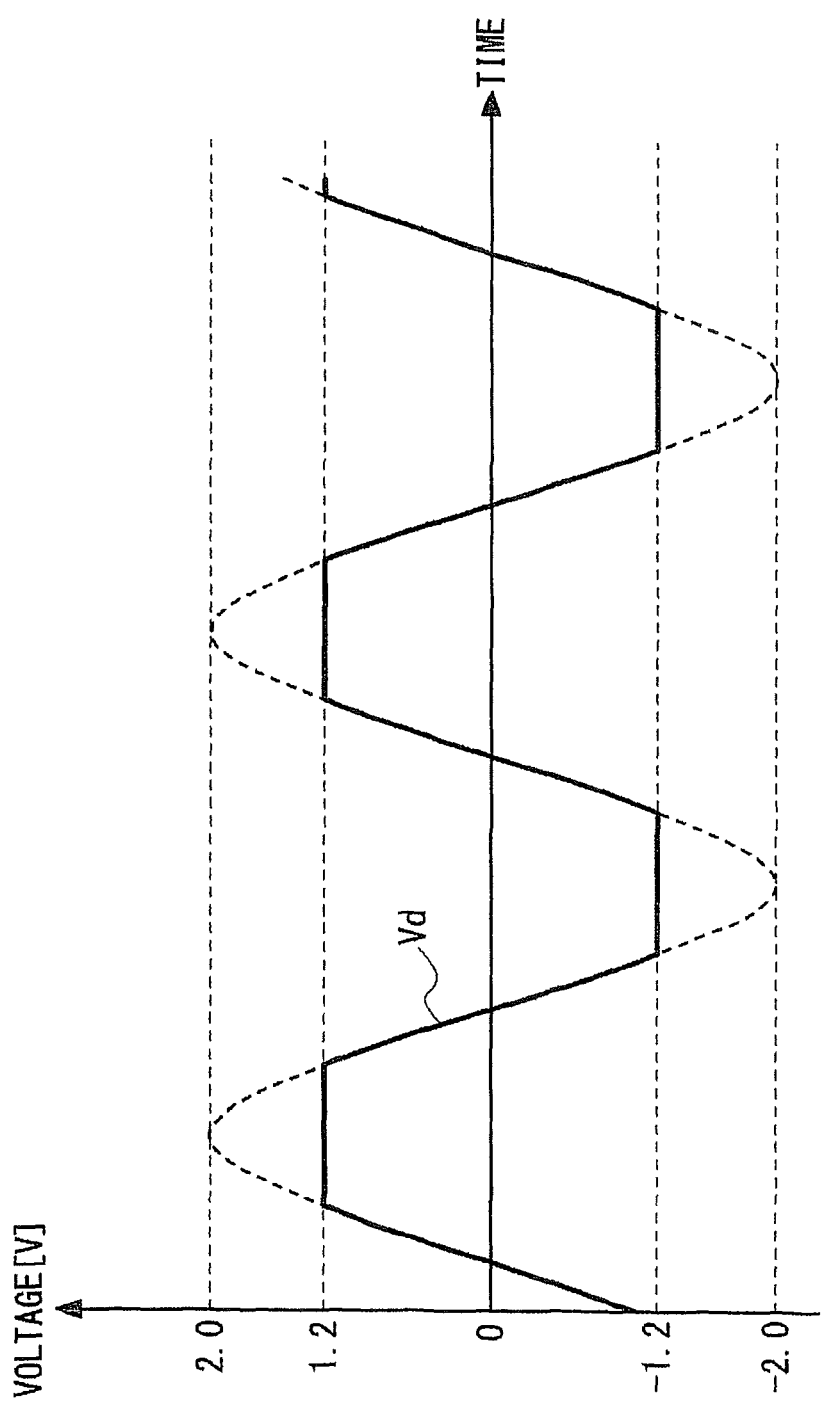
FIG. 7 is a graph showing a differential voltage between a constant reference voltage and an output voltage of a voltage-to-current converter circuit.
Figure 8:
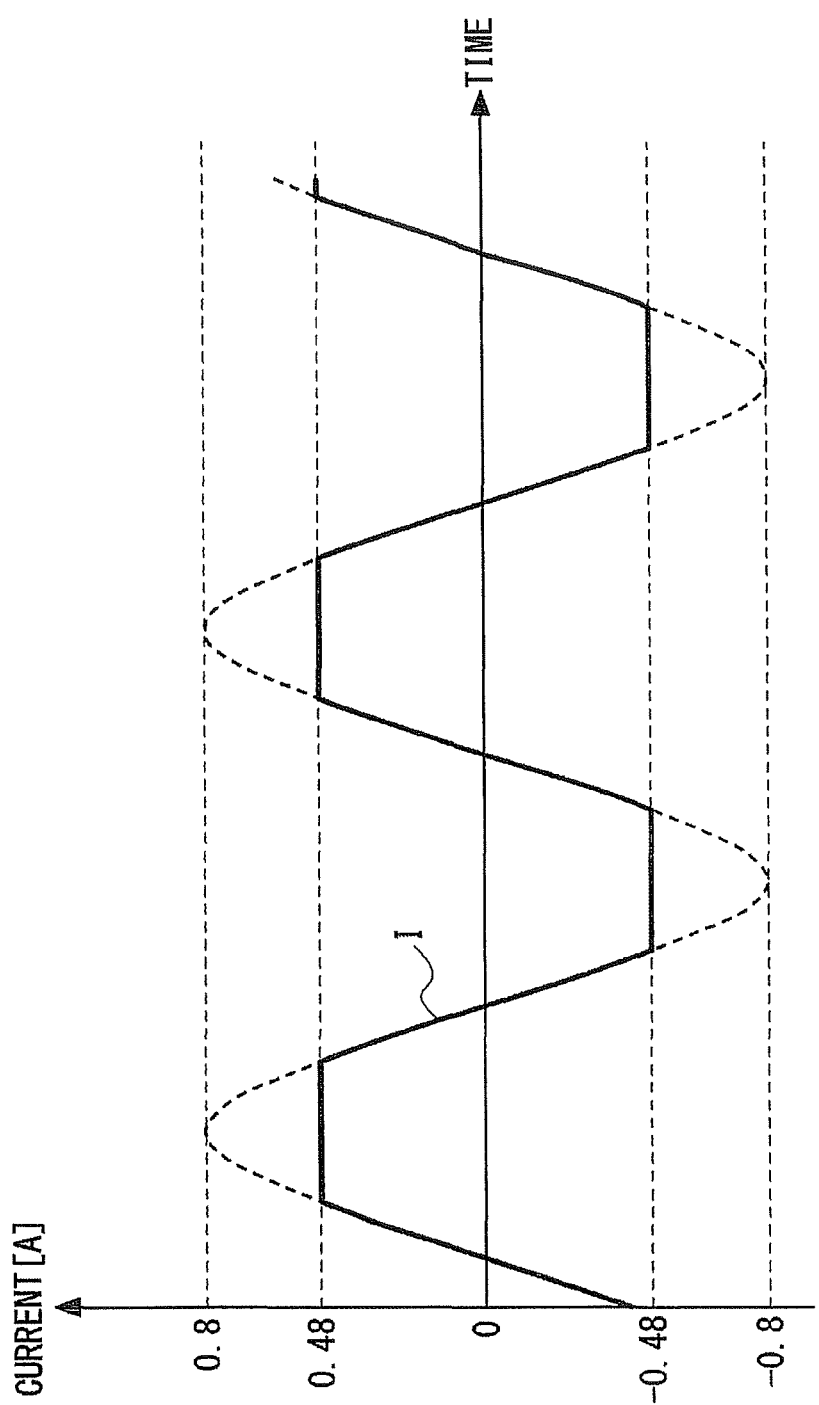
FIG. 8 is a graph showing a current flowing through a load when a reference voltage is constant.

FIG. 7 is a graph showing a differential voltage Vd between a constant reference voltage and an output voltage of a voltage-to-current converter circuit. FIG. 8 is a graph showing a current flowing through a load when a reference voltage is constant. As described above, because the output voltage Vout is a waveform where the top of a sinusoidal wave is cut, the differential voltage Vd is also a waveform where the top of a sinusoidal wave is cut. Accordingly, a current flowing through the load (2.5 kΩ) is also a waveform where the top of a sinusoidal wave is cut, and the current amplitude is limited to 480 μA.

Therefore, according to this configuration, since the reference voltage is an opposite phase to the output voltage of the voltage-to-current converter circuit, it is possible to pass a larger current compared with the case where the reference voltage is constant.

Note that, as a technique of using two amplifiers in parallel with each other, BTL (Bridged Transless) connection is generally known. However, while the BTL connection is a configuration that merely increases the output, this configuration increases the current output to the load and further decreases the output voltage amplitude of the voltage-to-current converter circuit compared with the case where the reference voltage is constant. It is thus understood that this configuration is different in operation from the BTL connection.

Second Embodiment

Figure 9:
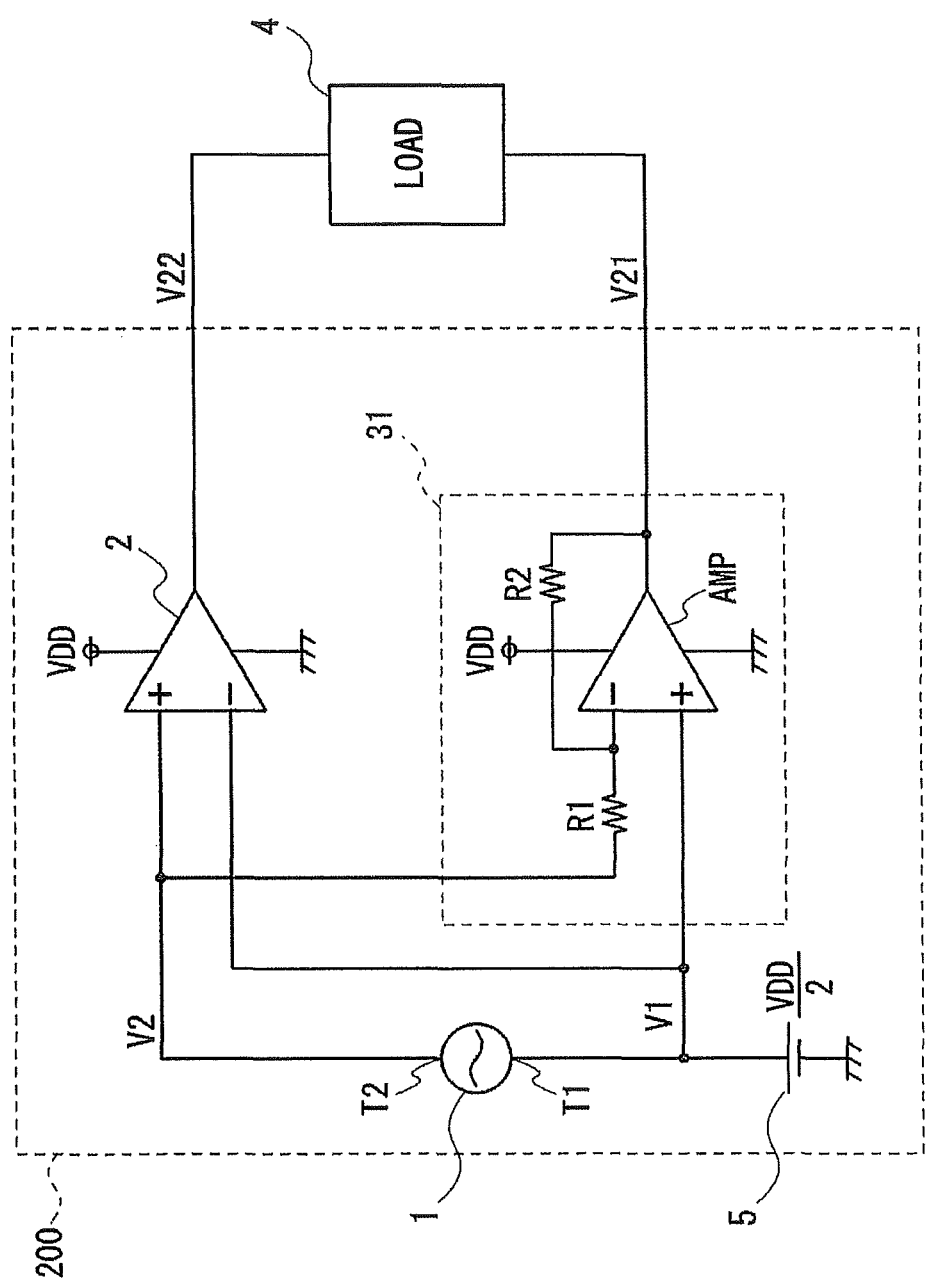
FIG. 9 is a circuit diagram showing a configuration of a drive circuit according to a second embodiment.

A drive circuit 200 according to a second embodiment is described hereinafter. FIG. 9 is a circuit diagram showing a configuration of the drive circuit 200 according to the second embodiment. The drive circuit 200 has a configuration where the reference voltage generator circuit 3 in the drive circuit 100 is replaced with a reference voltage generator circuit 31. The other configuration of the drive circuit 200 is the same as that of the drive circuit 100 and thus not redundantly described.

The reference voltage generator circuit 31 is composed of a resistor R1 (which is also referred to as a first resistor), a resistor R2 (which is also referred to as a second resistor) and a differential amplifier AMP.

The non-inverting input terminal of the differential amplifier AMP is connected to the terminal T1 of the AC voltage signal source 1 and the high-voltage terminal of the DC power supply 5. The inverting input terminal of the differential amplifier AMP is connected to the terminal T2 of the AC voltage signal source 1 and the positive phase input terminal of the voltage-to-current converter circuit 2 through the resistor R1. Further, the inverting input terminal of the differential amplifier AMP is connected to the output terminal of the differential amplifier AMP through the resistor R2.

A specific example of the operation of the drive circuit 200 is described hereinafter. As in the first embodiment, the reference voltage V21 is represented by the equation (1) and the output voltage V22 is represented by the equation (2). In the drive circuit 200, just like in the drive circuit 100 (FIG. 3), the reference voltage V21 and the output voltage V22 are in opposite phase and vary in the same manner.

It is thus understood that the drive circuit 200 can pass a current through a load just like the drive circuit 100, although the configuration of the reference voltage generator circuit is different.

Third Embodiment

Figure 10:
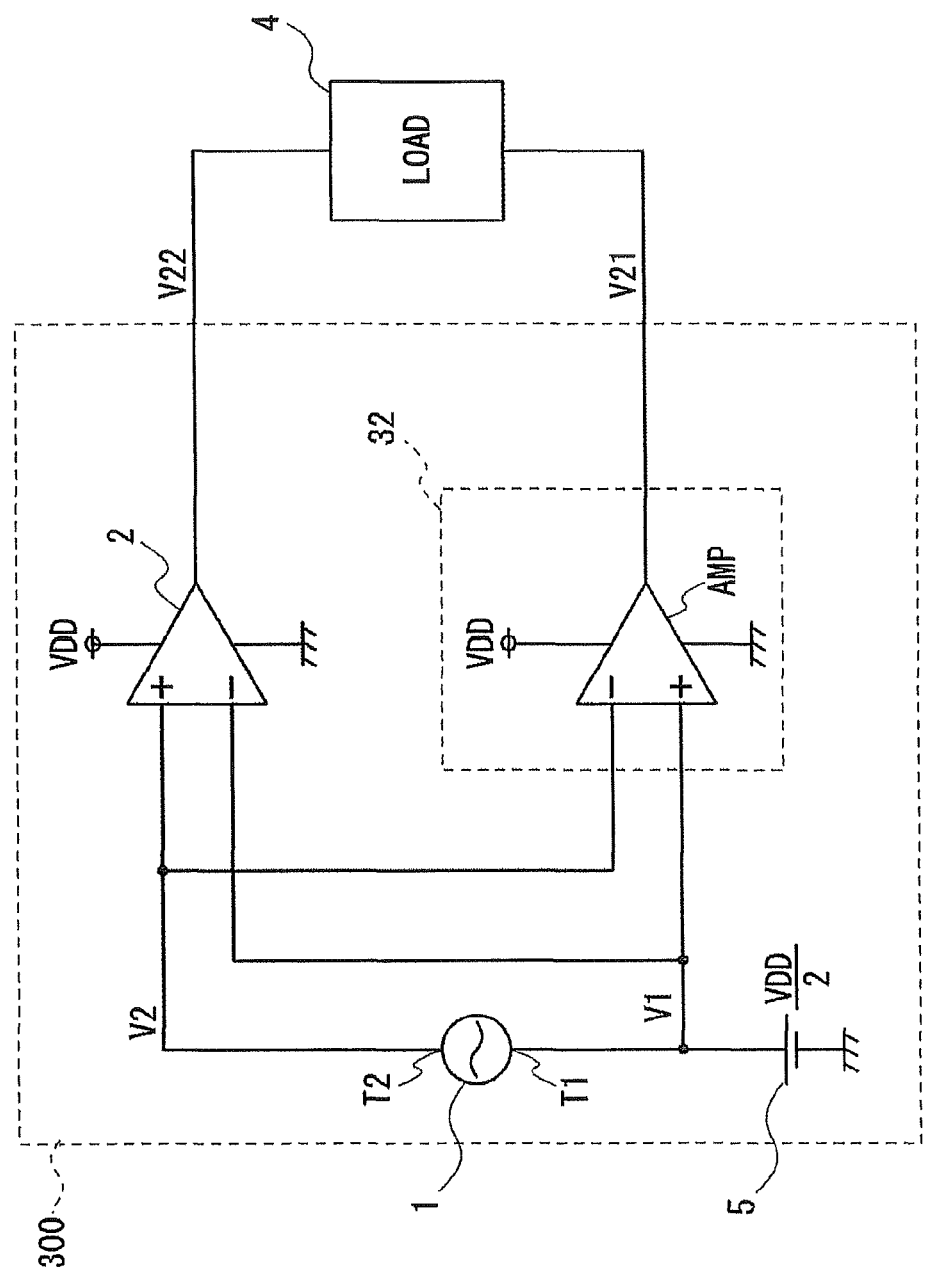
FIG. 10 is a circuit diagram showing a configuration of a drive circuit according to a third embodiment.

A drive circuit 300 according to a third embodiment is described hereinafter. FIG. 10 is a circuit diagram showing a configuration of the drive circuit 300 according to the third embodiment. The drive circuit 300 has a configuration where the reference voltage generator circuit 3 in the drive circuit 100 is replaced with a reference voltage generator circuit 32. The other configuration of the drive circuit 300 is the same as that of the drive circuit 100 and not redundantly described.

The reference voltage generator circuit 32 is composed of a differential amplifier AMP.

The non-inverting input terminal of the differential amplifier AMP is connected to the terminal T1 of the AC voltage signal source 1 and the high-voltage terminal of the DC power supply 5. The inverting input terminal of the differential amplifier AMP is connected to the terminal T2 of the AC voltage signal source 1 and the positive phase input terminal of the voltage-to-current converter circuit 2.

Figure 11:
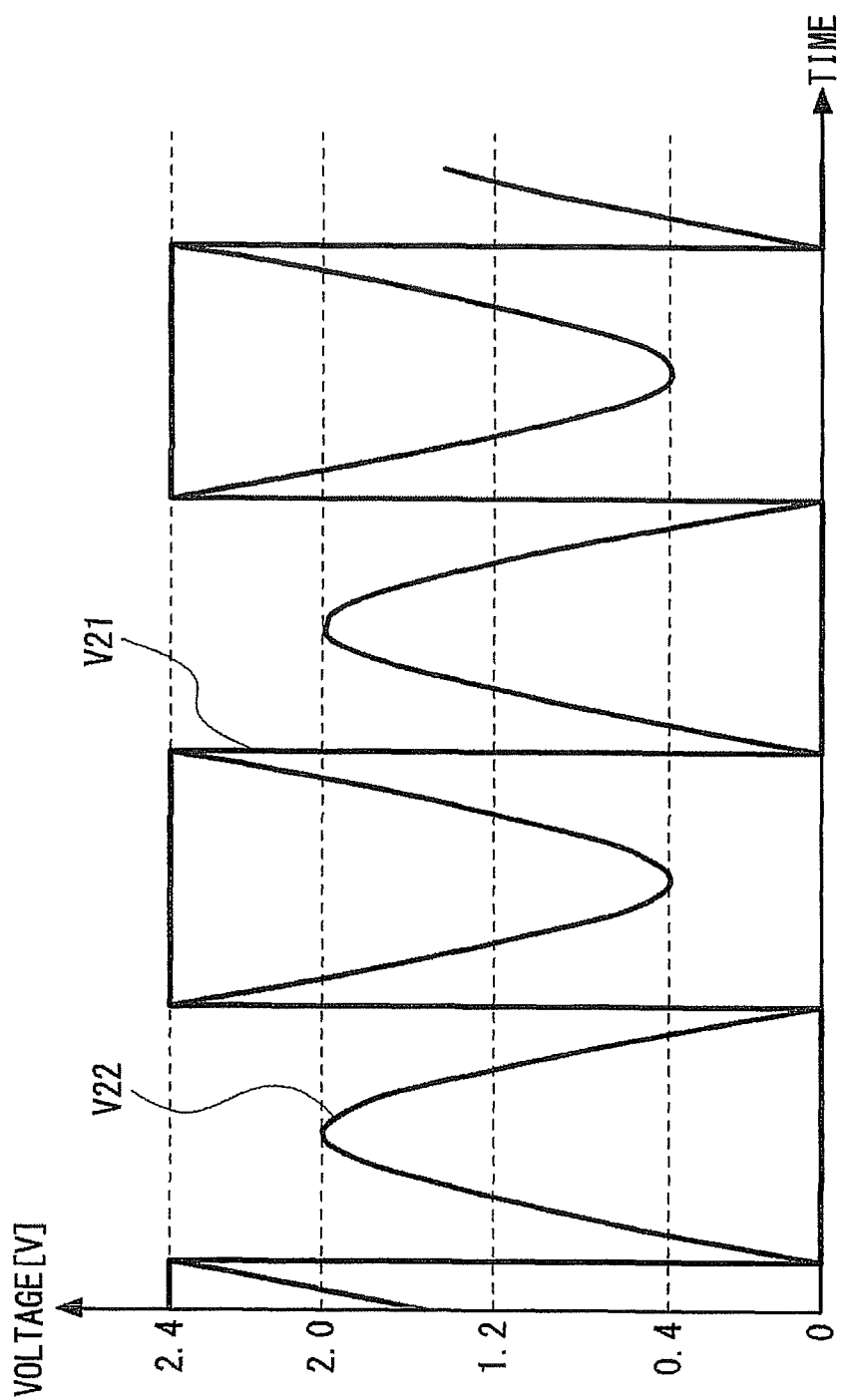
FIG. 11 is a graph showing a relationship between a reference voltage and an output voltage in a drive circuit according to the third embodiment.

A specific example of the operation of the drive circuit 300 is described hereinafter. FIG. 11 is a graph showing a relationship between the reference voltage V21 and the output voltage V22 in the drive circuit 300 according to the third embodiment. As shown in FIG. 11, the reference voltage V21 output from the reference voltage generator circuit 32 is a rectangular wave with a voltage varying at 0V or +2.4V according to a change in the relationship in level between the AC signal V2 and the DC voltage V1.

On the other hand, the output voltage V22 is a sinusoidal wave. When the reference voltage V21 is 0V, the output voltage V22 is a waveform that is projecting upward with an amplitude of 2.0V with reference to the reference voltage V21 (0V). On the other hand, when the reference voltage V21 is +2.4V, the output voltage V22 is a waveform that is projecting downward with an amplitude of 2.0V with reference to the reference voltage V21 (+2.4V). Thus, a differential voltage ΔV between the reference voltage V21 and the output voltage V22 varies in the same manner as in the drive circuit 100 (FIG. 4).

As described above, according to this configuration, a voltage applied to the load 4 is the same as in the drive circuit 100, although the waveforms of the reference voltage V21 and the output voltage V22 are different. Thus, the drive circuit 300 can supply a current to the load 4 just like the drive circuit 100. Further, in the drive circuit 300, the configuration of the reference voltage generator circuit can be simplified compared with that of the drive circuit 100.

Fourth Embodiment

Figure 12:
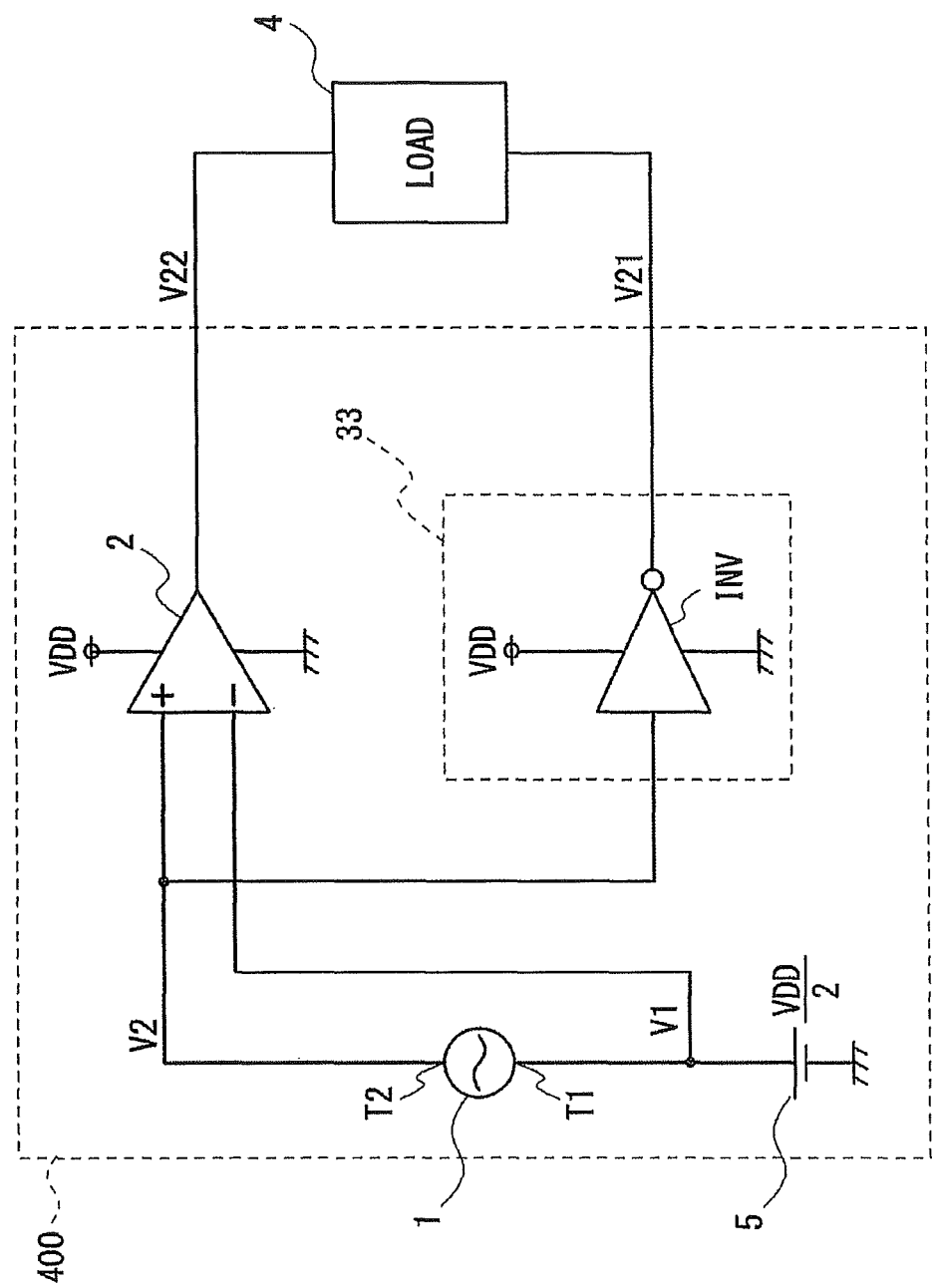
FIG. 12 is a circuit diagram showing a configuration of a drive circuit according to a fourth embodiment.

A drive circuit 400 according to a fourth embodiment is described hereinafter. FIG. 12 is a circuit diagram showing a configuration of the drive circuit 400 according to the fourth embodiment. The drive circuit 400 has a configuration where the reference voltage generator circuit 3 in the drive circuit 100 is replaced with a reference voltage generator circuit 33. The other configuration of the drive circuit 400 is the same as that of the drive circuit 100 and thus not redundantly described.

The reference voltage generator circuit 33 is composed of an inverter INV. An input terminal of the inverter INV is connected to the terminal T2 of the AC voltage signal source 1. An output terminal of the inverter INV is connected to the load 4.

A specific example of the operation of the drive circuit 400 is described hereinafter. The reference voltage V21 output from the inverter INV is 0V when the AC signal V2 is positive and it is +2.4V when the AC signal V2 is negative. Thus, the reference voltage V21 in the drive circuit 400 is the same waveform as in the drive circuit 300 (FIG. 11). As a result, the output voltage V22 in the drive circuit 400 is also the same waveform as in the drive circuit 300 (FIG. 11).

As described above, according to this configuration, a voltage applied to the load 4 is the same as in the drive circuit 300, although the configuration of the reference voltage generator circuit 3 is different. Thus, the drive circuit 400 can supply a current to the load 4 just like the drive circuit 100.

Fifth Embodiment

Figure 13:
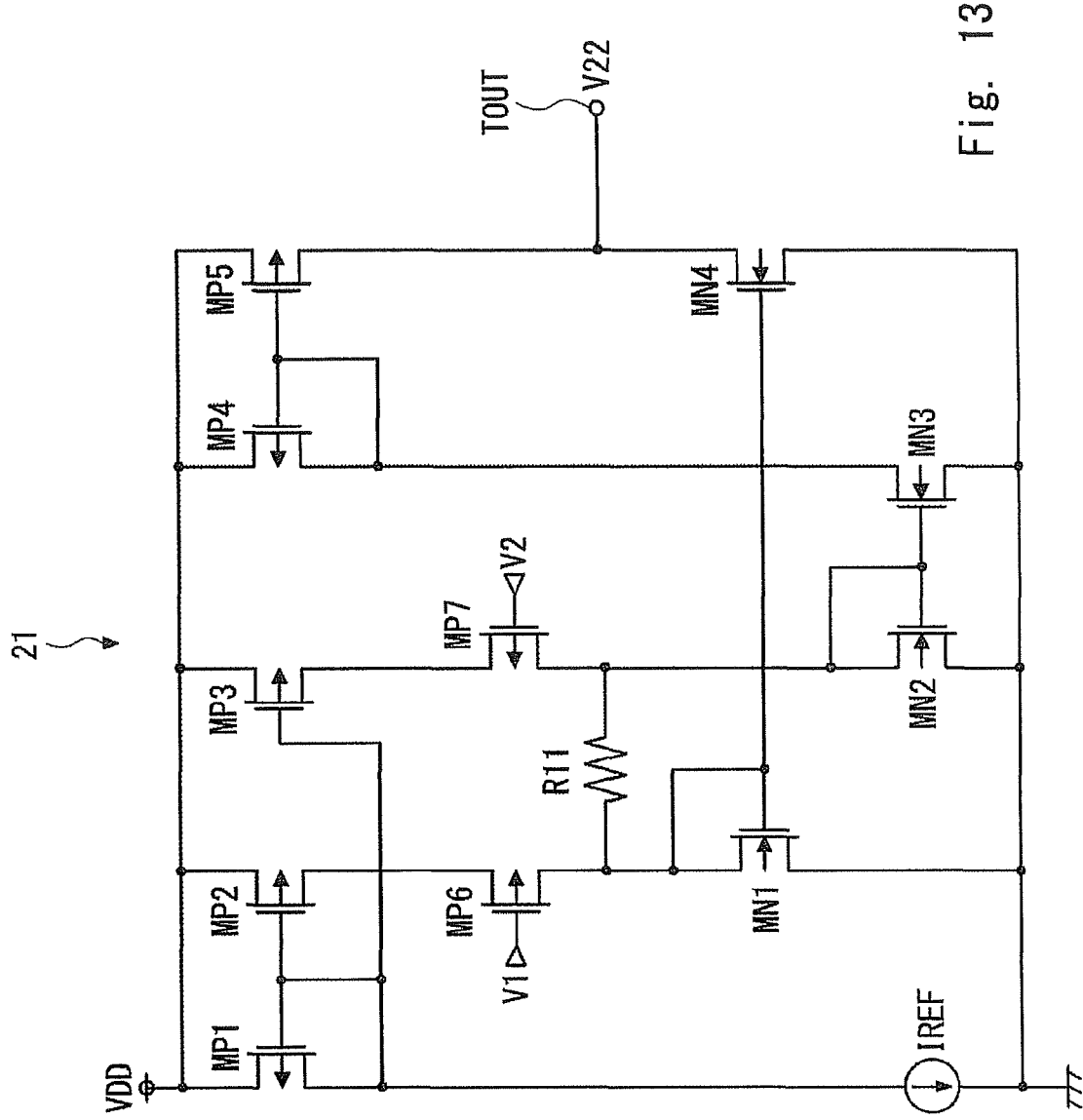
FIG. 13 is a circuit diagram showing a configuration of a voltage-to-current converter circuit according to a fifth embodiment.

A voltage-to-current converter circuit according to a fifth embodiment is described hereinafter. A voltage-to-current converter circuit 21 described in this embodiment is a specific example of the voltage-to-current converter circuit 2 described above. FIG. 13 is a circuit diagram showing a configuration of the voltage-to-current converter circuit 21 according to the fifth embodiment.

The voltage-to-current converter circuit 21 includes Pch transistors MP1 to MP7, Nch transistors MN1 to MN4, a resistor R11, and a current source IREF.

The power supply voltage VDD is supplied to the sources of the Pch transistors MP1 to MP5. The current source IREF is inserted between the drain and the ground of the Pch transistor MP1. The drain of the Pch transistor MP2 is connected to the source of the Pch transistor MP6. The drain of the Pch transistor MP3 is connected wo the source of the Pch transistor MP7. The gates of the Pch transistors MP1 to MP3 and the drain of the Pch transistor MP1 are respectively connected to each other.

The drain of the Pch transistor MP6 is connected to the drain of the Nch transistor MN1. The drain of the Pch transistor MP7 is connected to the drain of the Nch transistor MN2. The resistor R11 is connected between the drain of the Pch transistor MP6 and the drain of the Pch transistor MP7. The DC voltage V1 is applied to the gate of the Pch transistor MP6. The AC signal V2 is applied to the gate of the Pch transistor MP7. The source of the Nch transistor MN1 is connected to the ground. The source of the Nch transistor MN2 is connected to the ground.

The drain of the Pch transistor MP4 is connected to the drain of the Nch transistor MN3. The source of the Nch transistor MN3 is connected to the ground. The drain of the Pch transistor MP5 is connected to the drain of the Nch transistor MN4. The source of the Nch transistor MN4 is connected to the ground. The drain of the Pch transistor MP4 and the gates of the Pch transistor MP4 and MP5 are connected to each other.

The gate of the Nch transistor MN1, the drain of the Nch transistor MN1 and the gate of the Nch transistor MN4 are connected to each other. The gate of the Nch transistor MN2, the drain of the Nch transistor MN2 and the gate of the Nch transistor MN3 are connected to each other.

A node between the drain of the Pch transistor MP5 and the drain of the Nch transistor MN4 is connected to the output terminal TOUT. The output voltage V22 is output from the output terminal TOUT.

The Nch transistor MN1 and the Nch transistor MN2 are the transistors of the same size. The Nch transistor MN3 and the Nch transistor MN4 are the transistors of the same size. Further, the size ratio (S2/S1) between the size S1 of the Nch transistors MN1 and MN2 and the size S2 of the Nch transistors MN3 and MN4 is denoted by M (M is a positive real number).

The output current I of the voltage-to-current converter circuit 21 is represented by the following equation (3).

[Equation 3]

$$I = M\frac{V2 - V1}{R11} \quad (3)$$

As described above, the voltage-to-current converter circuit that outputs a current in accordance with the resistance of the resistor R11, the DC voltage V1, the AC signal V2 and the transistor size ratio can be specifically configured.

Sixth Embodiment

Figure 14:
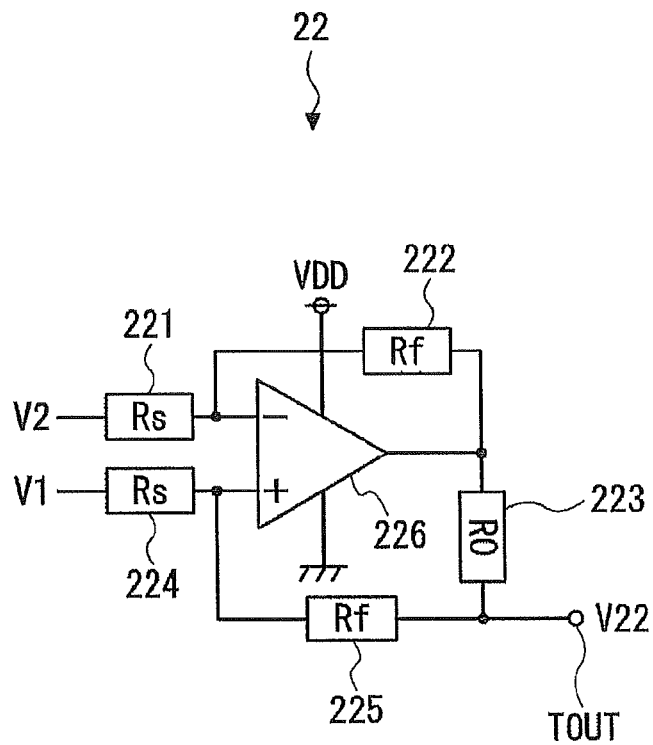
FIG. 14 is a circuit diagram showing a configuration of a voltage-to-current converter circuit according to a sixth embodiment.

A voltage-to-current converter circuit according to a sixth embodiment is described hereinafter. A voltage-to-current converter circuit 22 described in this embodiment is a specific example of the voltage-to-current converter circuit 2 described above. FIG. 14 is a circuit diagram showing a configuration of the voltage-to-current converter circuit 22 according to the sixth embodiment.

The voltage-to-current converter circuit 22 includes resistors 221 to 225 and a differential amplifier 226. The AC signal V2 is applied to one end of the resistor 221, and the other end is connected to the inverting input terminal of the differential amplifier 226. The resistor 222 is connected between the inverting input terminal of the differential amplifier 226 and the output terminal of the differential amplifier 226. The resistor 223 is connected between the output terminal of the differential amplifier 226 and the output terminal TOUT of the voltage-to-current converter circuit 22. The DC voltage V1 is applied to one end of the resistor 224, and the other end is connected to the non-inverting input terminal of the differential amplifier 226 and one end of the resistor 225. The other end of the resistor 225 is connected to the output terminal TOUT of the voltage-to-current converter circuit 22. The output voltage V22 is output from the output terminal TOUT.

The resistances of the resistor 221 and the resistor 224 are denoted by Rs. The resistances of the resistor 222 and the resistor 225 are denoted by Rf. The resistance of the resistor 223 is denoted by R0. Then, the output current I of the voltage-to-current converter circuit 22 is represented by the following equation (4).

[Equation 4]

$$I = -\frac{Rf}{Rs} \cdot \frac{V2 - V1}{R0} \quad (4)$$

As described above, the voltage-to-current converter circuit that outputs a current in accordance with the resistances of the resistors 221 to 225, the DC voltage V1 and the AC signal V2 can be specifically configured.

Seventh Embodiment

Figure 15:
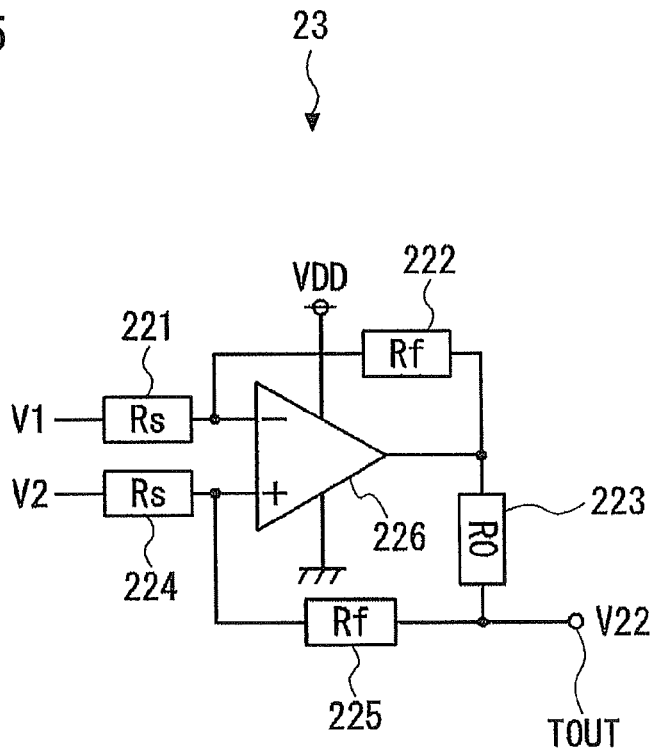
FIG. 15 is a circuit diagram showing a configuration of a voltage-to-current converter circuit according to a seventh embodiment.

A voltage-to-current converter circuit according to a seventh embodiment is described hereinafter. A voltage-to-current converter circuit 23 described in this embodiment is a specific example of the voltage-to-current converter circuit 2 described above. FIG. 15 is a circuit diagram showing a configuration of the voltage-to-current converter circuit 23 according to the seventh embodiment.

The voltage-to-current converter circuit 23 is a modified example of the voltage-to-current converter circuit 22. While the AC signal V2 is applied to the resistor 221 in the voltage-to-current converter circuit 22, the DC voltage V1 is applied to the resistor 221 in the voltage-to-current converter circuit 23. While the DC voltage V1 is applied to the resistor 224 in the voltage-to-current converter circuit 22, the AC signal V2 is applied to the resistor 224 in the voltage-to-current converter circuit 23. The other configuration of the voltage-to-current converter circuit 23 is the same as that of the voltage-to-current converter circuit 22 and thus not redundantly described.

The output current I of the voltage-to-current converter circuit 23 is represented by the following equation (5).

[Equation 5]

$$I = \frac{Rf}{Rs} \cdot \frac{V2 - V1}{R0} \quad (5)$$

As described above, the voltage-to-current converter circuit that outputs a current in accordance with the resistances of the resistors 221 to 225, the DC voltage V1 and the AC signal V2 can be specifically configured.

Eighth Embodiment

Figure 16:
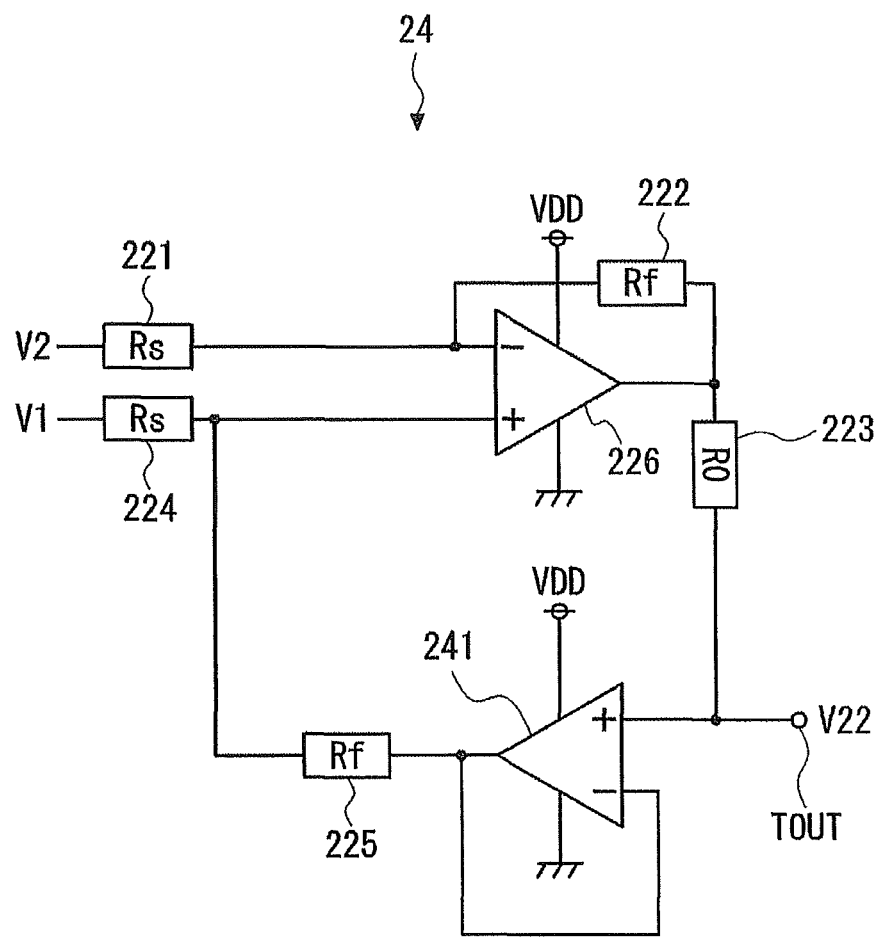
FIG. 16 is a circuit diagram showing a configuration of a voltage-to-current converter circuit according to an eighth embodiment.

A voltage-to-current converter circuit according to an eighth embodiment is described hereinafter. A voltage-to-current converter circuit 24 described in this embodiment is a specific example of the voltage-to-current converter circuit 2 described above. FIG. 16 is a circuit diagram showing a configuration of the voltage-to-current converter circuit 24 according to the eighth embodiment.

The voltage-to-current converter circuit 24 has a configuration in which a differential amplifier 241 is added to the voltage-to-current converter circuit 22. The DC voltage V1 is applied to one end of the resistor 224, and the other end is connected to the non-inverting input terminal of the differential amplifier 226 and one end of the resistor 225. The other end of the resistor 225 is connected to the output terminal and the inverting input terminal of the differential amplifier 241. The non-inverting input terminal of the differential amplifier 241 is connected to the output terminal TOUT of the voltage-to-current converter circuit 22. The output voltage V22 is output from the output terminal TOUT. The other configuration of the voltage-to-current converter circuit 24 is the same as that of the voltage-to-current converter circuit 22 and thus not redundantly described.

The output current I of the voltage-to-current converter circuit 24 is represented by the above-described equation (4). As described above, the voltage-to-current converter circuit that outputs a current in accordance with the resistances of the resistors 221 to 225, the DC voltage V1 and the AC signal V2 can be specifically configured.

Ninth Embodiment

Figure 17:
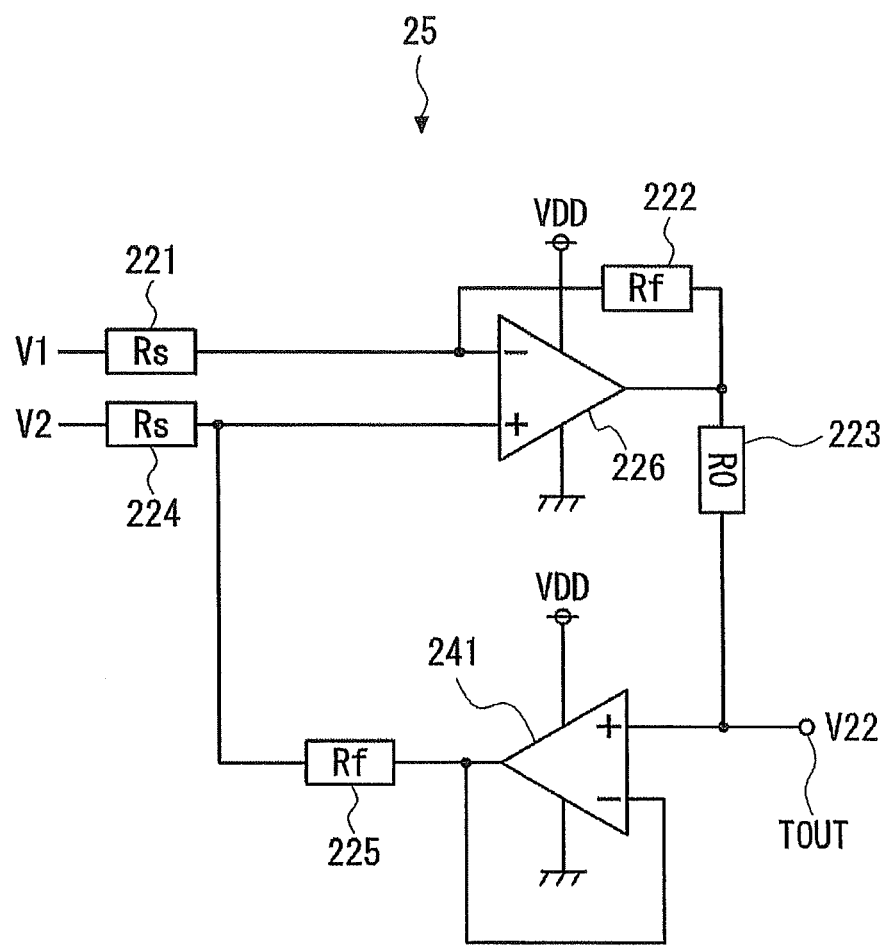
FIG. 17 is a circuit diagram showing a configuration of a voltage-to-current converter circuit according to a ninth embodiment.

A voltage-to-current converter circuit according to a ninth embodiment is described hereinafter. A voltage-to-current converter circuit 25 described in this embodiment is a specific example of the voltage-to-current converter circuit 2 described above. FIG. 17 is a circuit diagram showing a configuration of the voltage-to-current converter circuit 25 according to the ninth embodiment.

The voltage-to-current converter circuit 25 is a modified example of the voltage-to-current converter circuit 24. While the AC signal V2 is applied to the resistor 221 in the voltage-to-current converter circuit 24, the DC voltage V1 is applied to the resistor 221 in the voltage-to-current converter circuit 25. While the DC voltage V1 is applied to the resistor 224 in the voltage-to-current converter circuit 24, the AC signal V2 is applied to the resistor 224 in the voltage-to-current converter circuit 25. The other configuration of the voltage-to-current converter circuit 25 is the same as that of the voltage-to-current converter circuit 24 and thus not redundantly described.

The output current I of the voltage-to-current converter circuit 25 is represented by the above-described equation (5). As described above, the voltage-to-current converter circuit that outputs a current in accordance with the resistances of the resistors 221 to 225, the DC voltage V1 and the AC signal V2 can be specifically configured.

Tenth Embodiment

Figure 18:
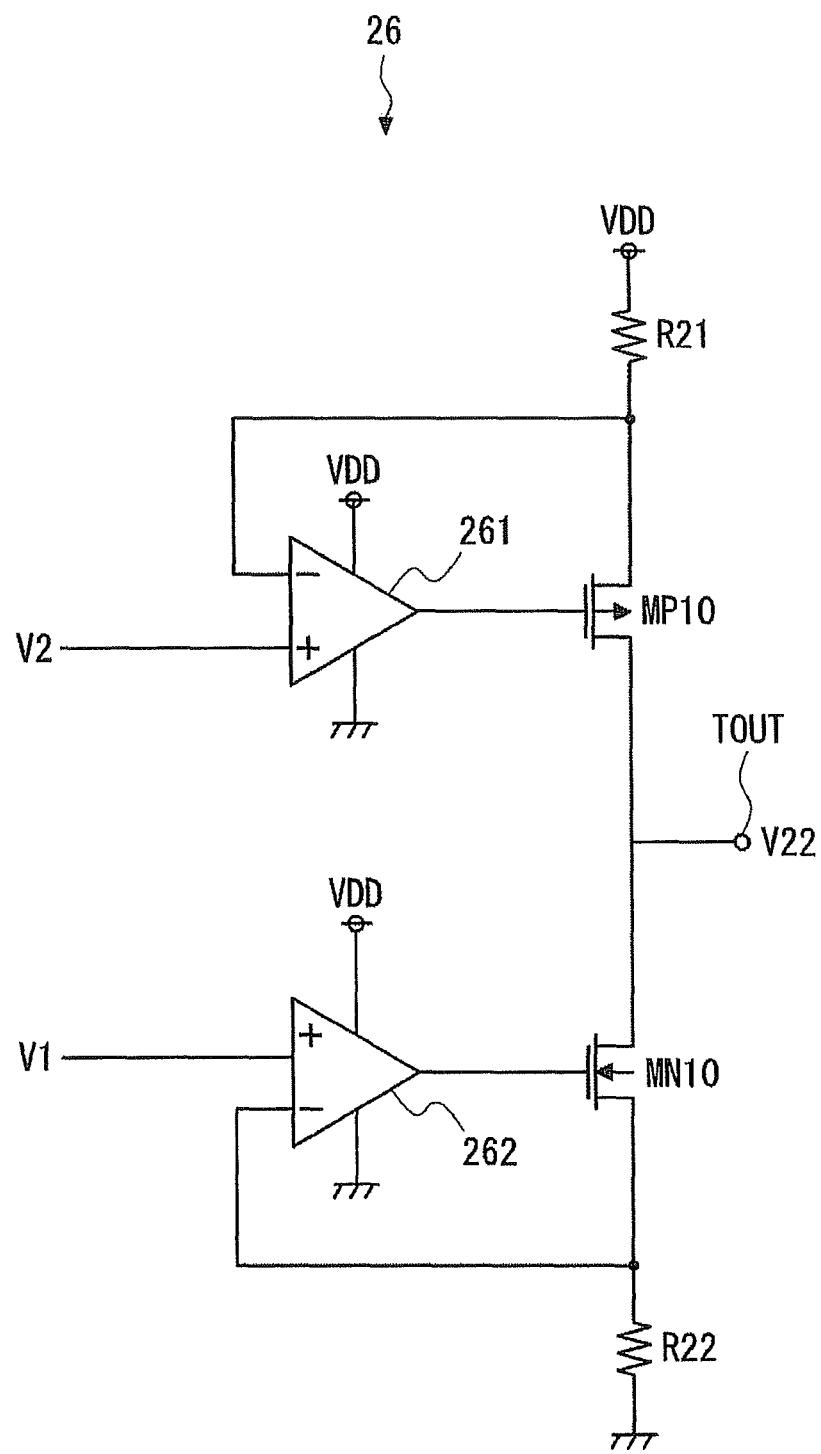
FIG. 18 is a circuit diagram showing a configuration of a voltage-to-current converter circuit according to a tenth embodiment.

A voltage-to-current converter circuit according to a tenth embodiment is described hereinafter. A voltage-to-current converter circuit 26 described in this embodiment is a specific example of the voltage-to-current converter circuit 2 described above. FIG. 18 is a circuit diagram showing a configuration of the voltage-to-current converter circuit 26 according to the tenth embodiment.

The voltage-to-current converter circuit 26 includes a Pch transistor MP10, an Nch transistor MN10, resistors R21 and R22, and differential amplifiers 261 and 262.

The power supply voltage VDD is applied to one end of the resistor R21, and the other end is connected to the source of the Pch transistor MP10. The drain of the Pch transistor MP10 is connected to the drain of the Nch transistor MN10. One end of the resistor R22 is connected to the ground, and the other and is connected to the source of the Nch transistor MN10. A node between the drain of the Pch transistor MP10 and the drain of the Nch transistor MN10 is connected to the output terminal TOUT. The output voltage V22 is output from the output terminal TOUT.

The AC signal V2 is applied to the non-inverting input terminal of the differential amplifier 261. The inverting input terminal of the differential amplifier 261 is connected to the source of the Pch transistor MP10. The output terminal of the differential amplifier 261 is connected to the gate of the Pch transistor MP10. The non-inverting input terminal of the differential amplifier 261 corresponds to the positive phase input terminal of the voltage-to-current converter circuit 26.

The DC voltage V1 is applied to the non-inverting input terminal of the differential amplifier 262. The inverting input terminal of the differential amplifier 262 is connected to the source of the Nch transistor MN10. The output terminal of the differential amplifier 262 is connected to the gate of the Nch transistor MN10. The non-inverting input terminal of the differential amplifier 262 corresponds to the negative phase input terminal of the voltage-to-current converter circuit 26.

Eleventh Embodiment

A phase adjuster according to an eleventh embodiment is described hereinafter. A phase adjuster described in this embodiment is a modified example of the phase adjuster 6 described above.

Figure 19:
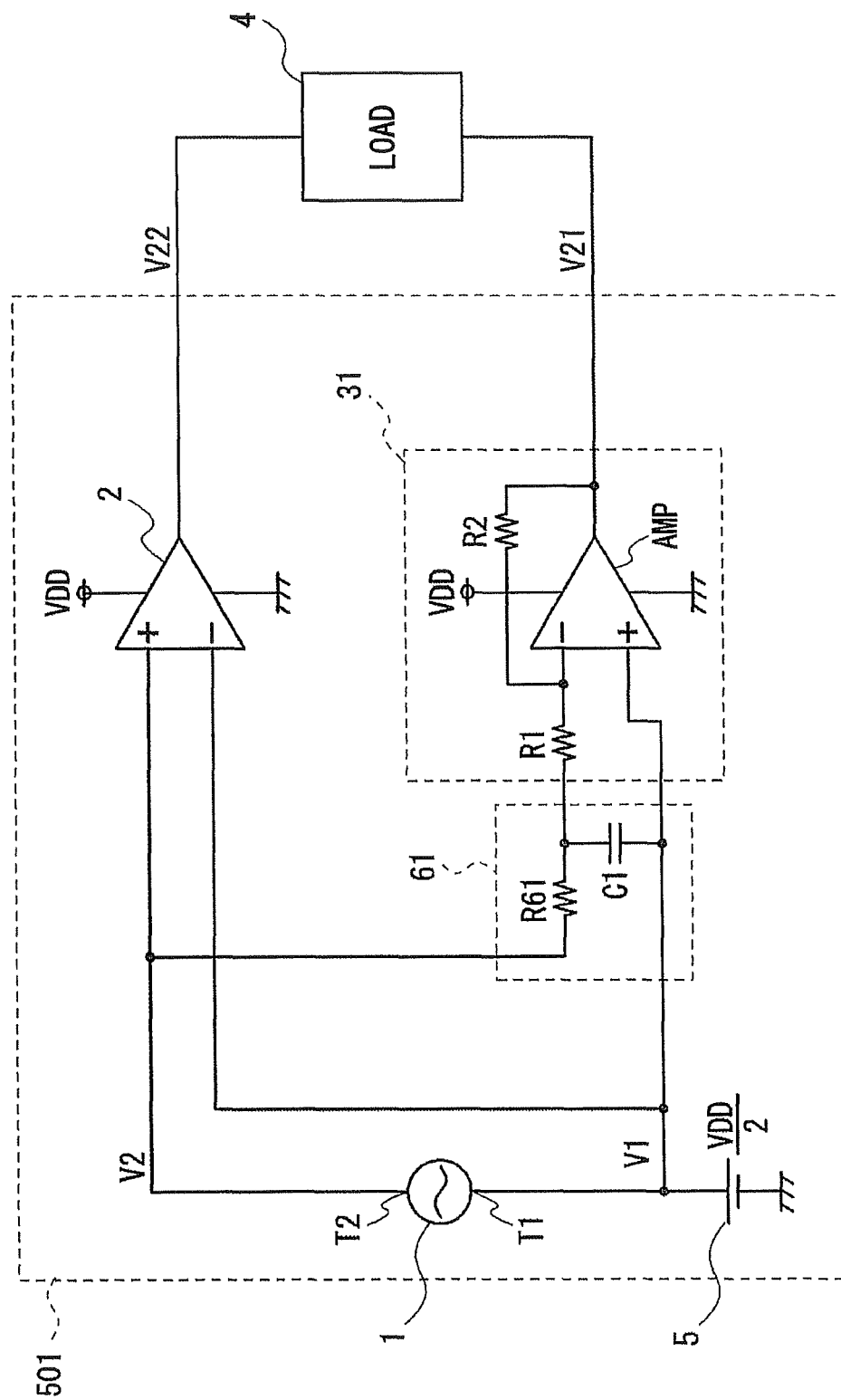
FIG. 19 is a circuit diagram showing a configuration of a drive circuit according to an eleventh embodiment.

A phase adjuster 61, which is a first modified example of the phase adjuster, is described hereinafter. FIG. 19 is a circuit diagram showing a configuration of a drive circuit 501 according to the eleventh embodiment. The drive circuit 501 has a configuration in which the phase adjuster 61 is added to the drive circuit 200 shown in FIG. 9.

The phase adjuster 61 includes a resistor R61 and a capacitor C1 and is configured as a passive low-pass filter. The resistor R61 is inserted between the terminal T2 of the AC voltage signal source 1 and the positive phase input terminal of the voltage-to-current converter circuit 2, and the resistor R1 in the reference voltage generator circuit 31. One end of the capacitor C1 is connected to a node between the resistor R61 and the resistor R1 in the reference voltage generator circuit 31. The other end of the capacitor C1 is connected to the non-inverting input terminal of the differential amplifier AMP in the reference voltage generator circuit 31.

Because the phase adjuster 61 is a low-pass filter, it is possible to make an adjustment to delay the phase of the reference voltage V21 in this configuration.

Figure 20:
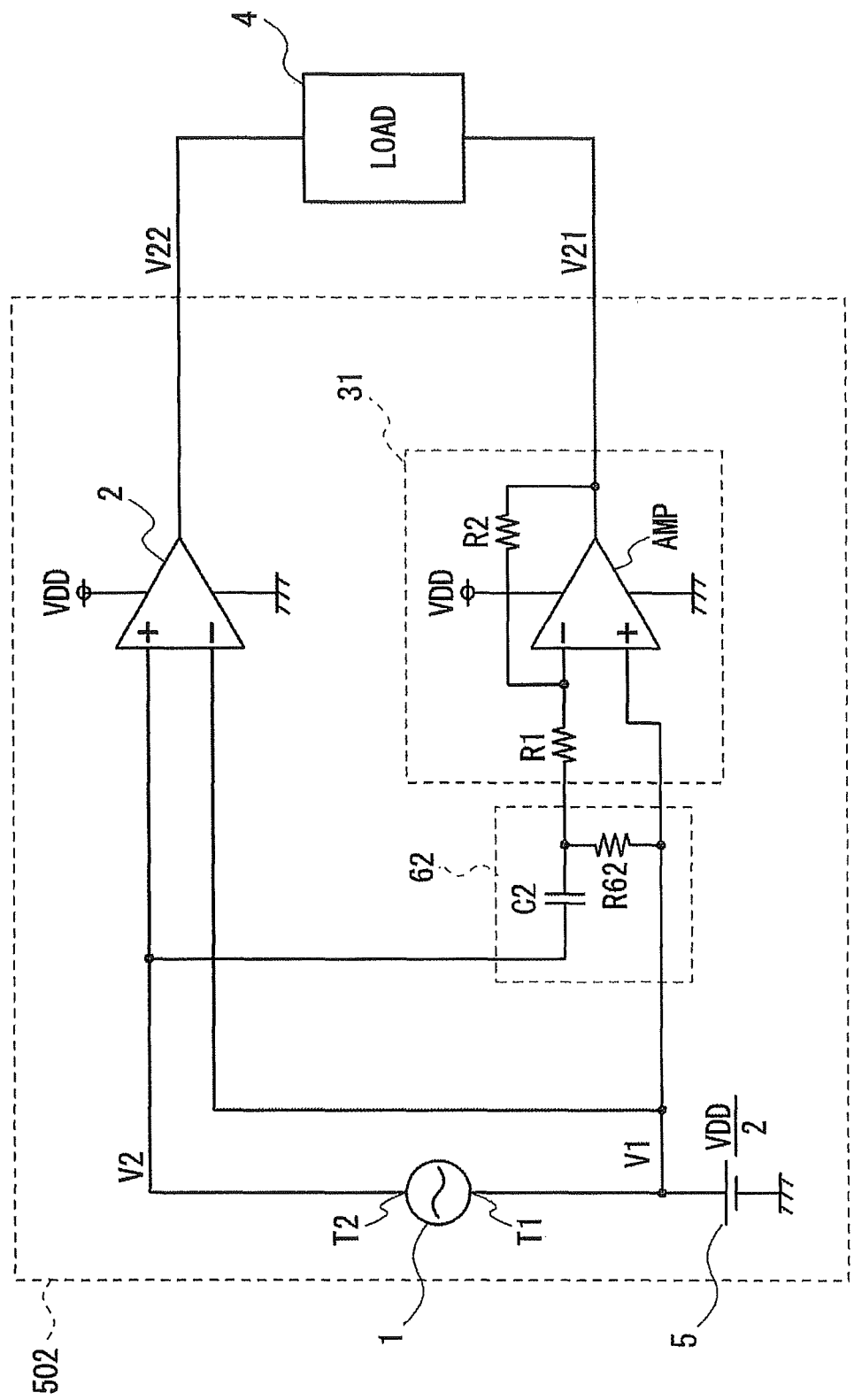
FIG. 20 is a circuit diagram showing a configuration of a drive circuit according to the eleventh embodiment.

The phase adjuster 62, which is a second modified example of the phase adjuster, is described hereinafter. FIG. 20 is a circuit diagram showing a configuration of a drive circuit 502 according to the eleventh embodiment. The phase adjuster 62 includes a resistor R62 and a capacitor C2 and is configured as a passive high-pass filter. The capacitor C2 is inserted between the terminal T2 of the AC voltage signal source 1 and the positive phase input terminal of the voltage-to-current converter circuit 2, and the resistor R1 in the reference voltage generator circuit 31. One end of the resistor R62 is connected to a node between the capacitor C2 and the resistor R1 in the reference voltage generator circuit 31. The other end of the resistor R62 is connected to the non-inverting input terminal of the differential amplifier AMP in the reference voltage generator circuit 31.

Because the phase adjuster 62 is a high-pass filter, it is possible to make an adjustment to advance the phase of the reference voltage V21 in this configuration.

Figure 21:
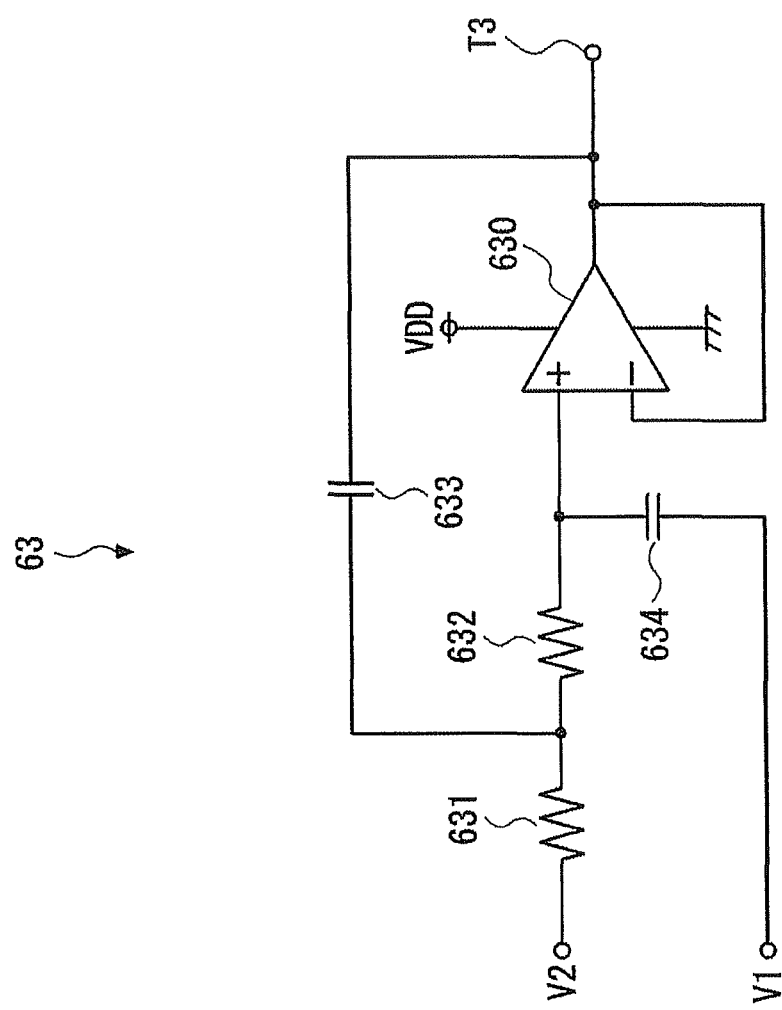
FIG. 21 is a circuit diagram showing a configuration of a phase adjuster according to the eleventh embodiment.

A phase adjuster 63, which is a third modified example of the phase adjuster, is described hereinafter. FIG. 21 is a circuit diagram showing a configuration of the phase adjuster 63, which one example of the phase adjuster according to the eleventh embodiment. The phase adjuster 63 includes a differential amplifier 630, resistors 631 and 632, and capacitors 633 and 634, and is configured as an active low-pass filter.

The AC signal V2 is applied to one end of the resistor 631. The other end of the resistor 631 is connected to one end of the resistor 632 and one end of the capacitor 633. The other end of the resistor 632 is connected to the non-inverting input terminal of the differential amplifier 630 and one end of the capacitor 634. The other end of the capacitor 633 is connected to the output terminal of the differential amplifier 630. The DC voltage V1 is applied to the other end of the capacitor 634. The inverting input terminal of the differential amplifier 630 is connected to the output terminal of the differential amplifier 630. Further, the output terminal of the differential amplifier 630 is connected to the terminal T3. The terminal T3 is connected to the reference voltage generator circuit.

Because the phase adjuster 63 is a low-pass filter, it is possible to make an adjustment to delay the phase of the reference voltage V21 in this configuration.

Figure 22:
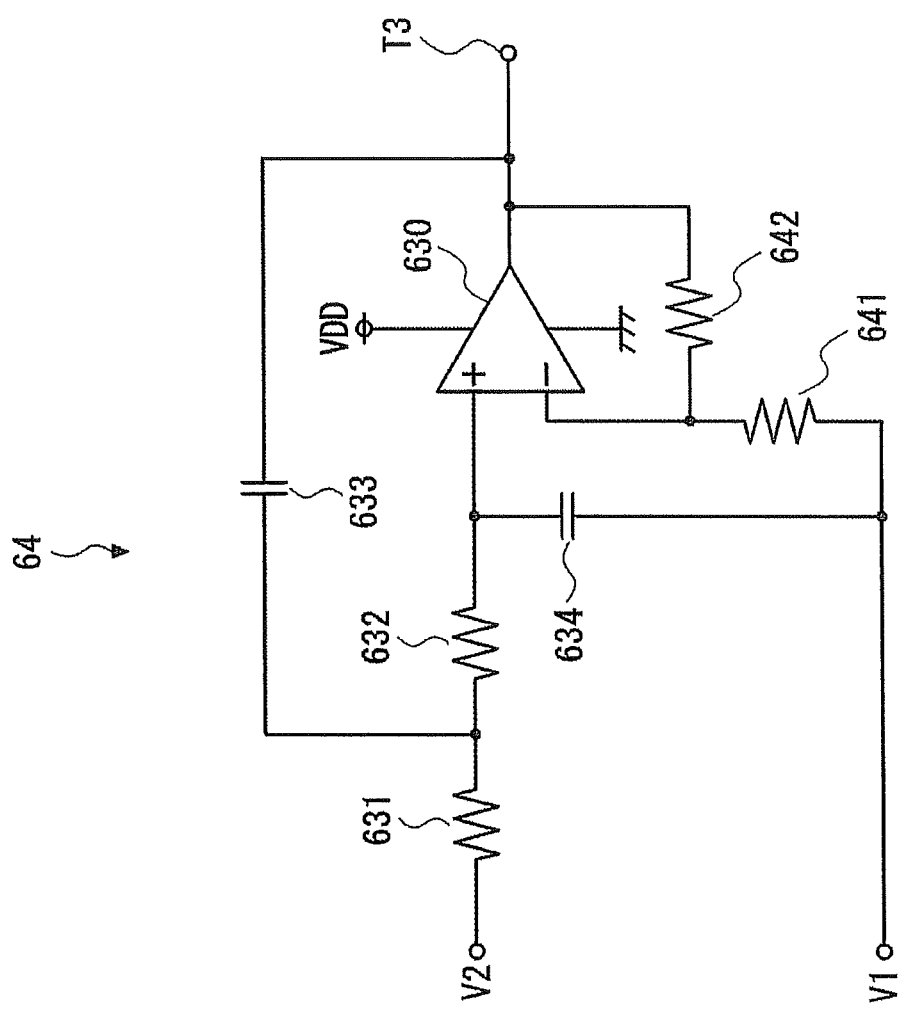
FIG. 22 is a circuit diagram showing a configuration of a phase adjuster according to the eleventh embodiment.

A phase adjuster 64, which is a fourth modified example of the phase adjuster, is described hereinafter. FIG. 22 is a circuit diagram showing a configuration of the phase adjuster 64, which one example of the phase adjuster according to the eleventh embodiment. The phase adjuster 64 has a configuration in which resistors 641 and 642 are added to the phase adjuster 63. One end of the resistor 641 is connected to the inverting input terminal of the differential amplifier 630, and the DC voltage V1 is applied to the other end of the resistor 641. The resistor 642 is inserted between the inverting input terminal of the differential amplifier 630 and the output terminal of the differential amplifier 630. The other configuration of the phase adjuster 64 is the same as that of the phase adjuster 63 and thus not redundantly described.

Because the phase adjuster 64 is a low-pass filter, it is possible to make an adjustment to delay the phase of the reference voltage V21 in this configuration.

Figure 23:
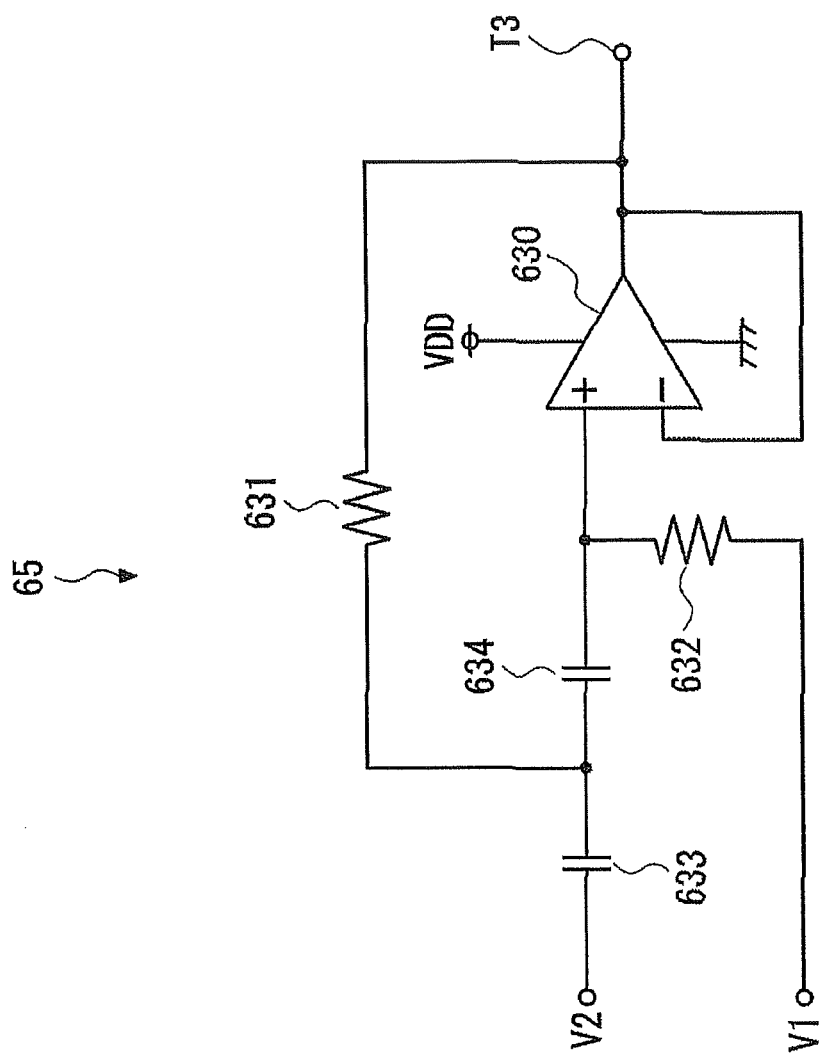
FIG. 23 is a circuit diagram showing a configuration of a phase adjuster according to the eleventh embodiment.

A phase adjuster 65, which is a fifth modified example of the phase adjuster, is described hereinafter. FIG. 23 is a circuit diagram showing a configuration of the phase adjuster 65, which one example of the phase adjuster according to the eleventh embodiment. The phase adjuster 65 is configured as an active high-pass filter. The phase adjuster 65 has a configuration in which the resistor 631 and the capacitor 633 are replaced with each other and further the resistor 632 and the capacitor 634 are replaced with each other in the phase adjuster 63 described above.

Because the phase adjuster 65 is a high-pass filter, it is possible to make an adjustment to advance the phase of the reference voltage V21 in this configuration.

Figure 24:
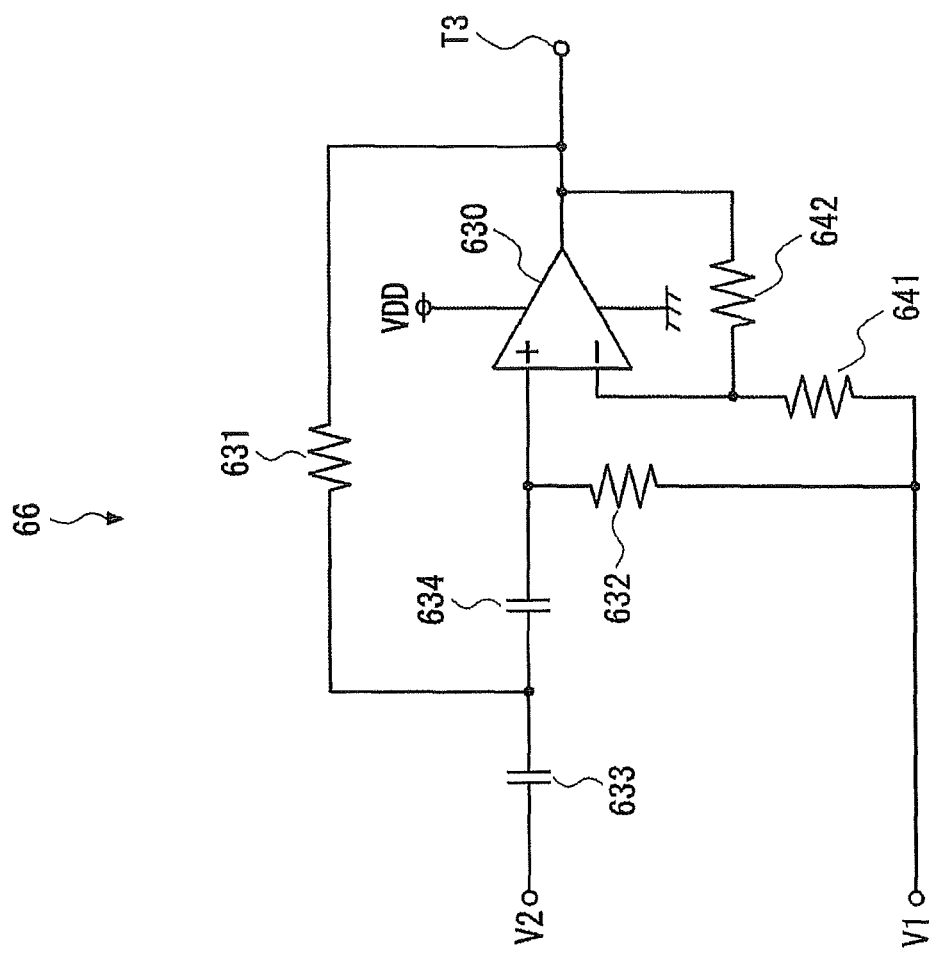
FIG. 24 is a circuit diagram showing a configuration of a phase adjuster according to the eleventh embodiment.

A phase adjuster 66, which is a sixth modified example of the phase adjuster, is described hereinafter. FIG. 24 is a circuit diagram showing a configuration of the phase adjuster 66, which one example of the phase adjuster according to the eleventh embodiment. The phase adjuster 66 has a configuration in which resistors 641 and 642 are added to the phase adjuster 65. The resistors 641 and 642 are the same as those in the phase adjuster 64 and thus not redundantly described.

Because the phase adjuster 66 is a high-pass filter, it is possible to make an adjustment to advance the phase of the reference voltage V21 in this configuration.

Figure 25:
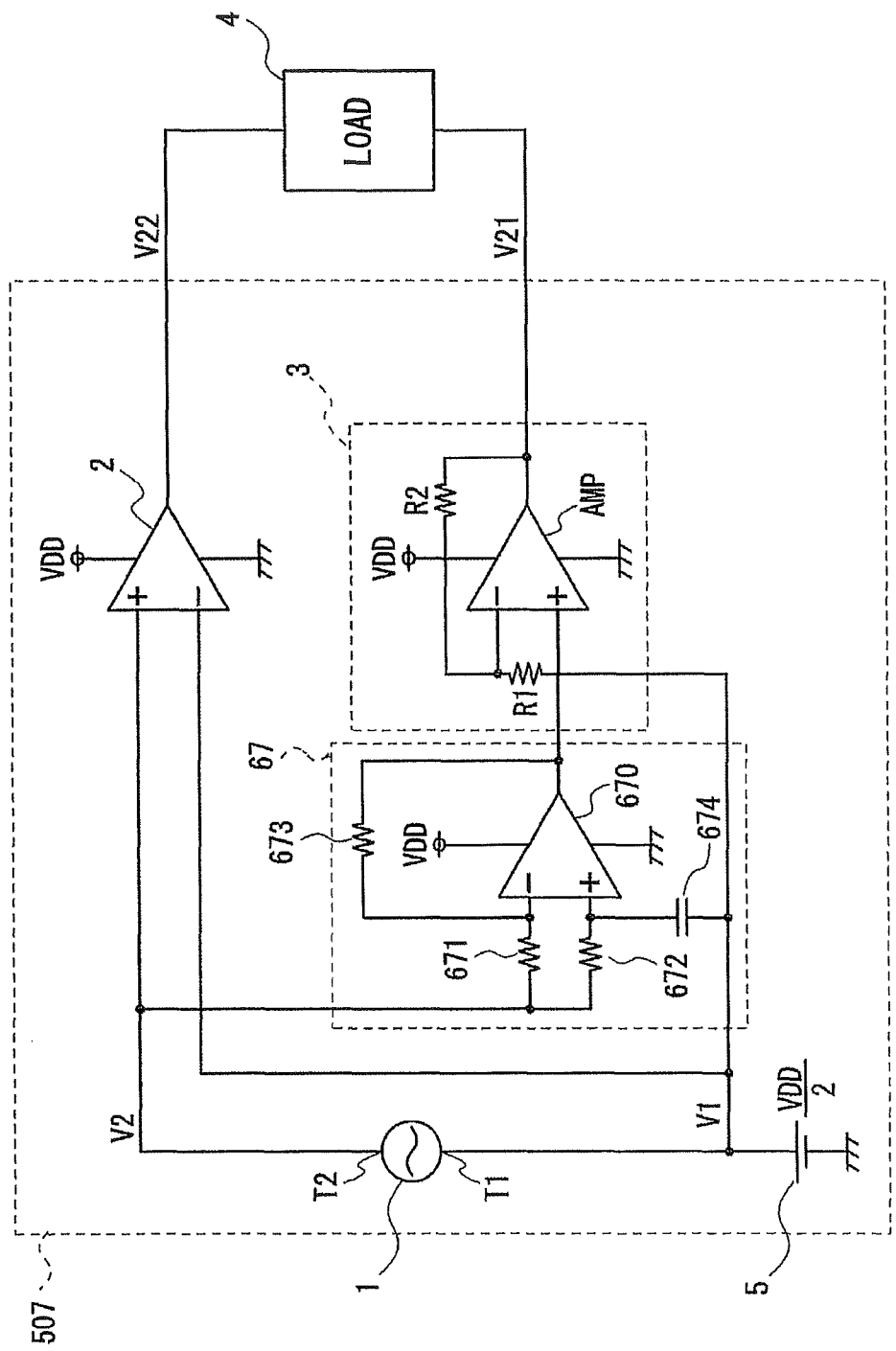
FIG. 25 is a circuit diagram showing a configuration of a drive circuit according to the eleventh embodiment.

A phase adjuster 67, which is a seventh modified example of the phase adjuster, is described hereinafter. FIG. 25 is a circuit diagram showing a configuration of a drive circuit 507 according to the eleventh embodiment. The drive circuit 507 has a configuration in which the phase adjuster 6 in the drive circuit 100 is replaced by a phase adjuster 67. The phase adjuster 67 includes a differential amplifier 670, resistors 671 to 673 and a capacitor 674 and is configured as an all-pass filter.

The AC signal V2 is applied to one end of the resistor 671, and the other end is connected to the inverting input terminal of the differential amplifier 670. The AC signal V2 is applied to one end of the resistor 672, and the other end is connected to the non-inverting input terminal of the differential amplifier 670. The resistor 673 is inserted between the inverting input terminal of the differential amplifier 670 and the output terminal of the differential amplifier 670. Further, the output terminal of the differential amplifier 670 is connected to the non-inverting input terminal of the differential amplifier AMP in the reference voltage generator circuit 3. The DC voltage V1 is applied to one end of the capacitor 674, and the other end is connected to the non-inverting input terminal of the differential amplifier 670. Note that the differential amplifier 670 is inserted between the power supply voltage VDD and the ground and thereby receives power supply.

As described above, in this configuration, it is possible to make an adjustment to delay the phase of the reference voltage V21. Further, because the above-described phase adjusters 61 to 66 are RC filters, an adjustment of the phase of the reference voltage V21 causes a change in the voltage amplitude. On the other hand, because the phase adjuster 67 is an all-pass filter, it is possible to make an adjustment of the phase of the reference voltage V21 without change in the voltage amplitude.

Figure 26:
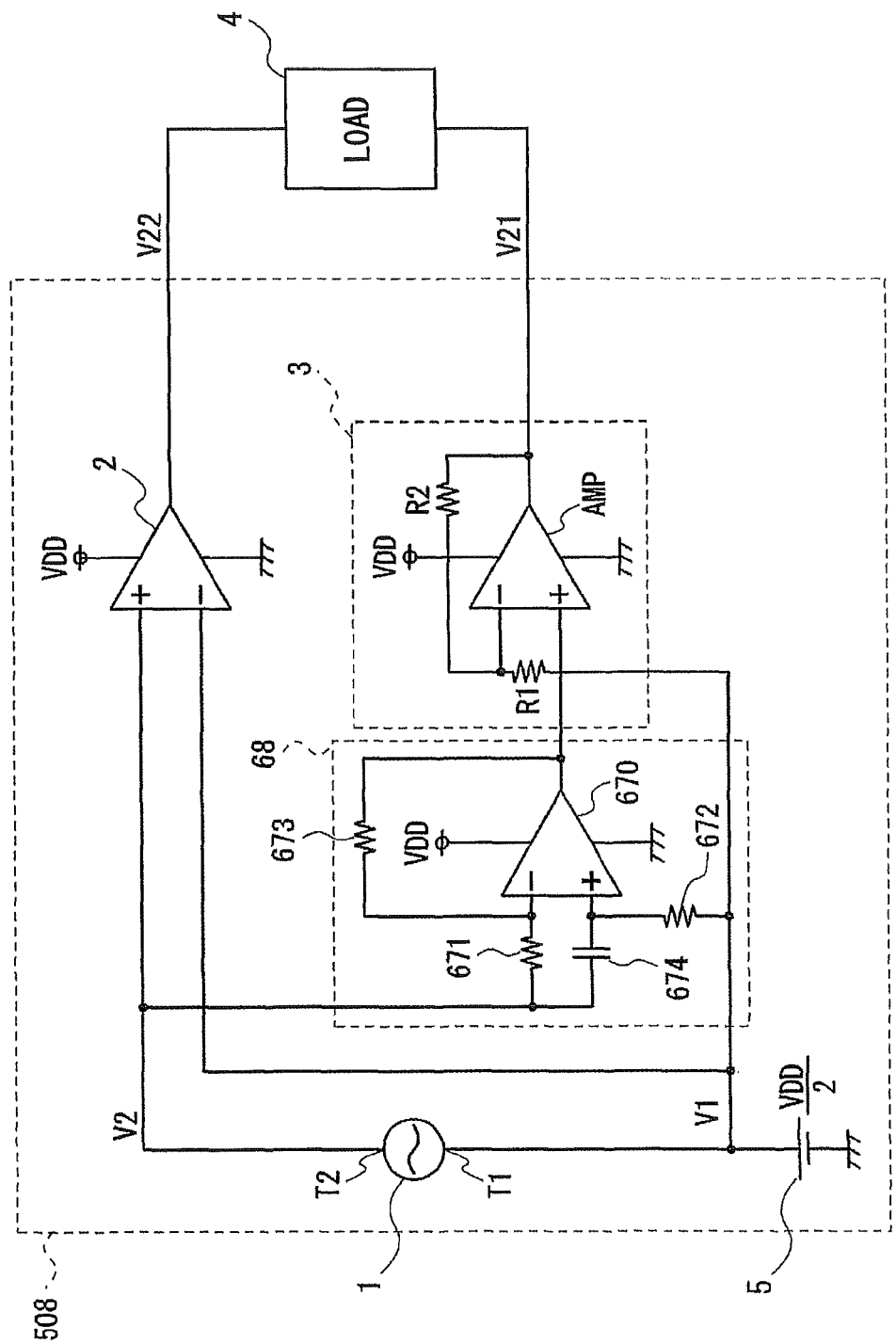
FIG. 26 is a circuit diagram showing a configuration of a drive circuit according to the eleventh embodiment.

A phase adjuster 68, which is an eighth modified example of the phase adjuster, is described hereinafter. FIG. 26 is a circuit diagram showing a configuration of a drive circuit 508 according to the eleventh embodiment. The drive circuit 508 has a configuration in which the phase adjuster 6 in the drive circuit 100 is replaced by a phase adjuster 68. The phase adjuster 68 has a configuration in which the resistor 672 and the capacitor 674 in the phase adjuster 67 are replaced with each other. The other configuration of the phase adjuster 68 is the same as that of the phase adjuster 67 and thus not redundantly described.

As described above, in this configuration, it is possible to make an adjustment to advance the phase of the reference voltage V21. Further, because the above-described phase adjusters 61 to 66 are RC filters, an adjustment of the phase of the reference voltage V21 causes a change in the voltage amplitude. On the other hand, because the phase adjuster 68 is an all-pass filter, it is possible to make an adjustment of the phase of the reference voltage V21 without change in the voltage amplitude.

Figure 27:
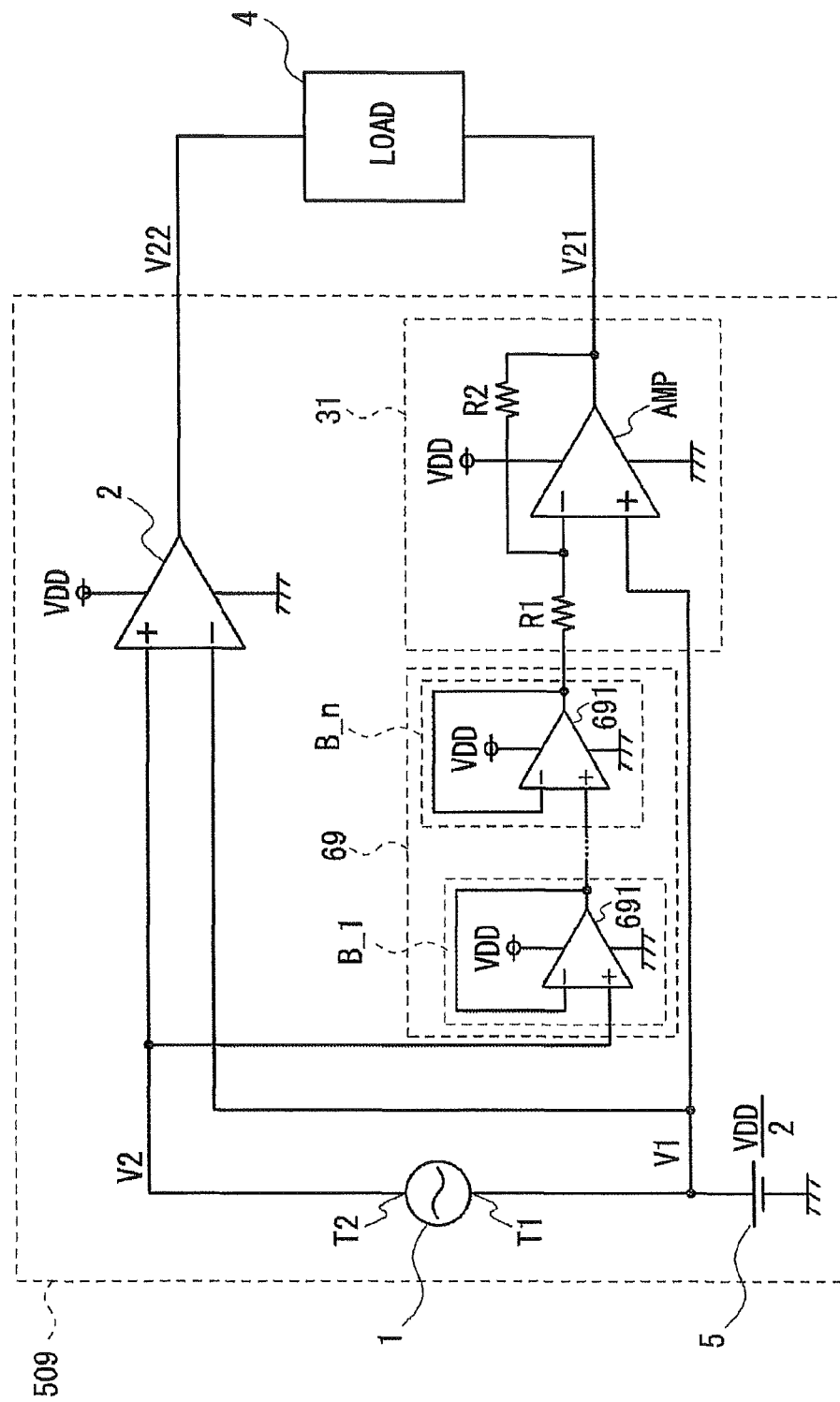
FIG. 27 is a circuit diagram showing a configuration of a drive circuit according to the eleventh embodiment.

A phase adjuster 69, which is a ninth modified example of the phase adjuster, is described hereinafter. FIG. 27 is a circuit diagram showing a configuration of a drive circuit 509 according to the eleventh embodiment. The drive circuit 509 has a configuration in which the phase adjuster 69 is added to the drive circuit 200. The phase adjuster 69 includes n (n is an integer of 1 or more) number of buffers B_1 to B_n that are in cascade connection.

Each of the buffers B_1 to B_n is composed of a differential amplifier 691. The inverting input terminal of the differential amplifier 691 is connected to the output terminal of the differential amplifier 691.

The AC signal V2 is applied to the non-inverting input terminal of the differential amplifier 691 that constitutes the buffer B_1 in the first stage. Likewise, the non-inverting input terminal of the differential amplifier 691 that constitutes the k-th (k is an integer of $2 \leq k \leq n-1$) buffer B_k is connected to the output terminal of the differential amplifier 691 that constitutes the (k−1)th buffer B_k−1. The output terminal of the differential amplifier 691 that constitutes the n-th buffer B_n is connected to the inverting input terminal of the reference voltage generator circuit 3. Note that the differential amplifier 691 that constitute the buffers B_1 to B_n is inserted between the power supply voltage VDD and the ground and thereby receives power supply.

The phase adjuster 69 having the multiple stage buffers can delay an AC signal passing through it. As described above, in this configuration, it is possible to make an adjustment to delay the phase of the reference voltage V21.

Figure 28:
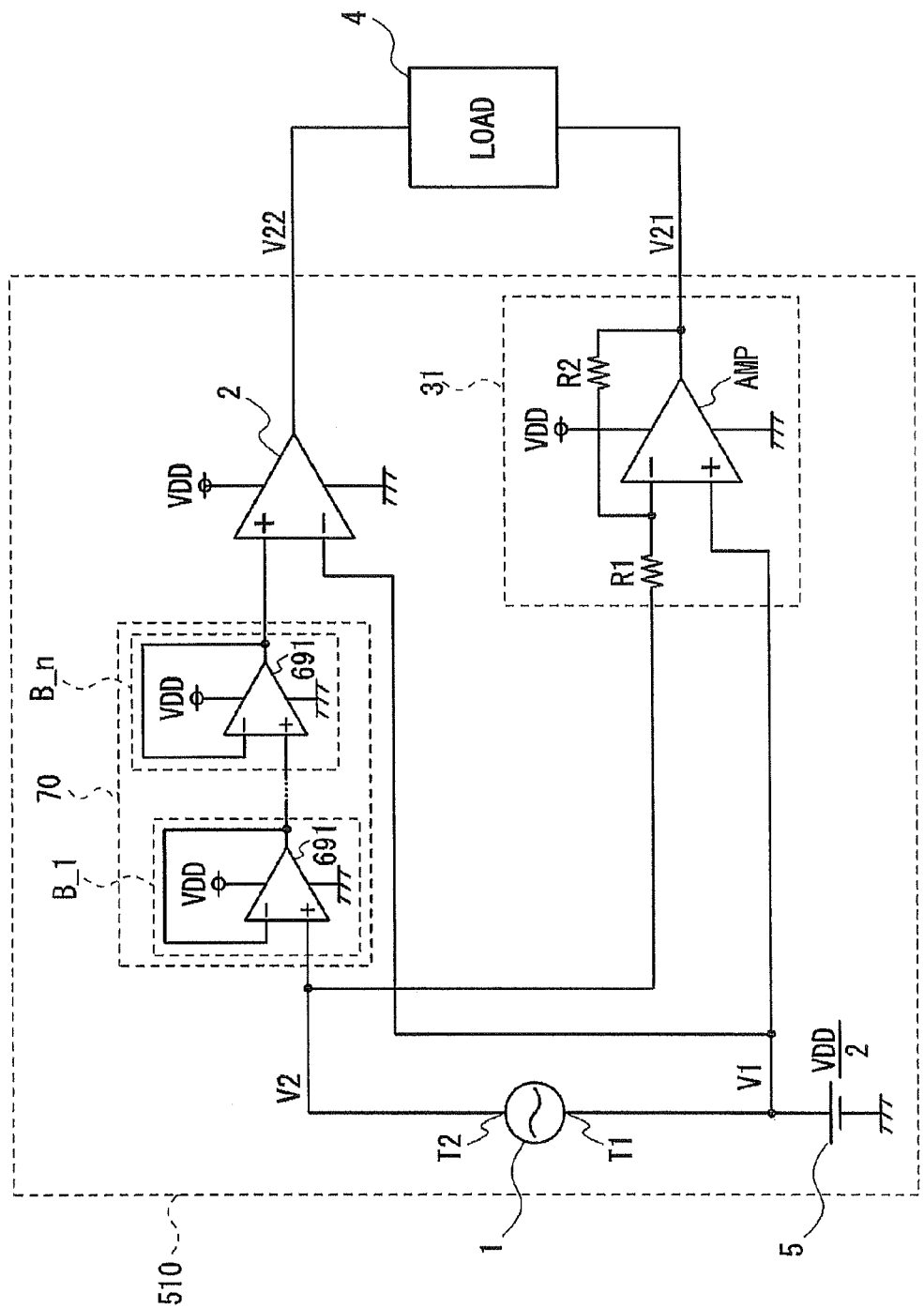
FIG. 28 is a circuit diagram showing a configuration of a drive circuit according to the eleventh embodiment.

A phase adjuster 70, which is a tenth modified example of the phase adjuster, is described hereinafter. FIG. 28 is a circuit diagram showing a configuration of a drive circuit 510 according to the eleventh embodiment. The drive circuit 510 has a configuration in which the phase adjuster 70 is added to the drive circuit 200. The phase adjuster 70 has a configuration in which a connected position of the phase adjuster 69 is changed.

The output terminal of the differential amplifier 691 that constitutes the n-th buffer B_n is connected to the positive phase input terminal of the voltage-to-current converter circuit 2. The other configuration of the phase adjuster 70 is the same as that of the phase adjuster 69 and thus not redundantly described.

The phase adjuster 70 having the multiple stage buffers can delay an AC signal passing through it. As described above, in this configuration, it is possible to make an adjustment to advance the phase of the reference voltage V21.

Twelfth Embodiment

Figure 29:
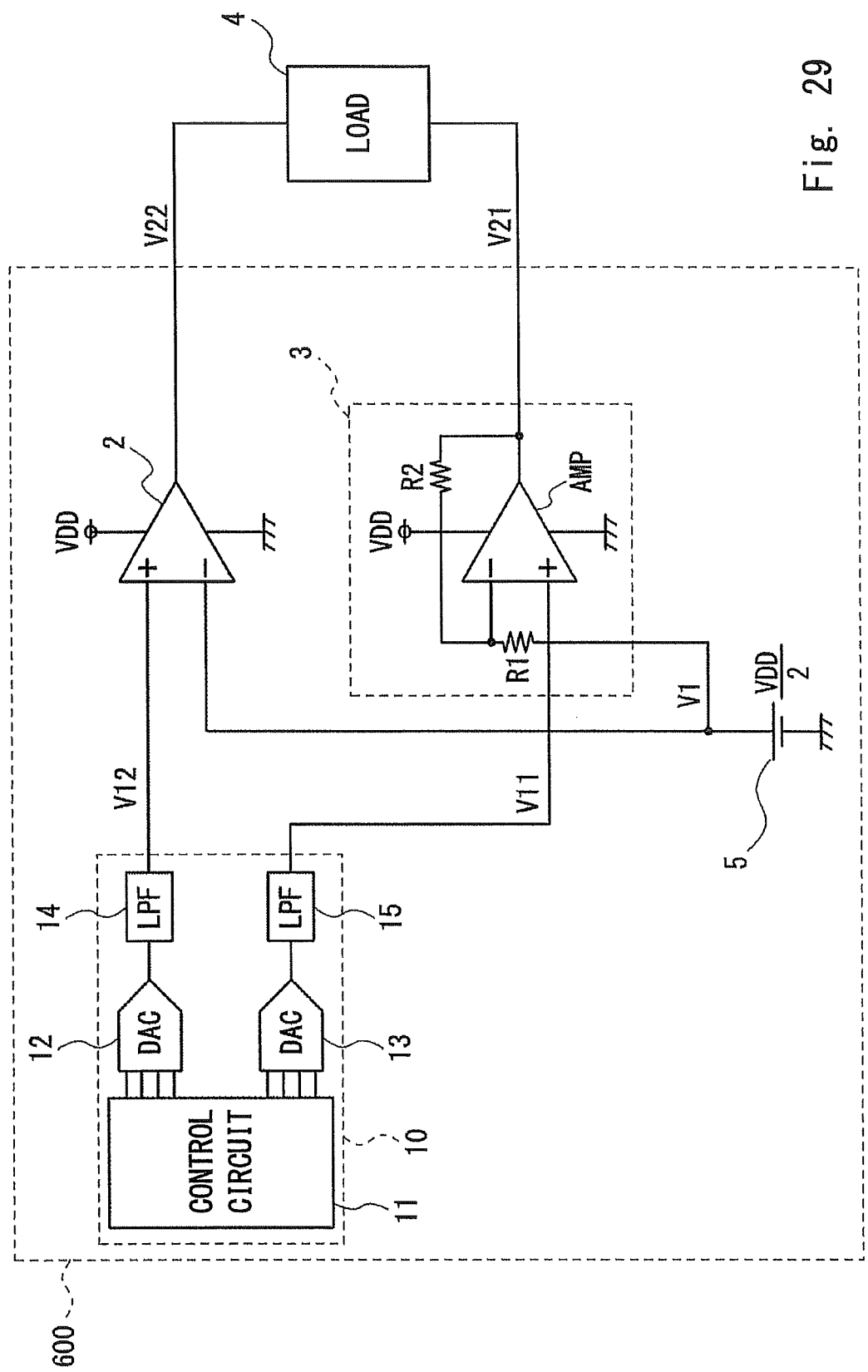
FIG. 29 is a circuit diagram showing a configuration of a drive circuit according to a twelfth embodiment.

A drive circuit 600 according to a twelfth embodiment is described hereinafter. FIG. 29 is a circuit diagram showing a configuration of the drive circuit 600 according to the twelfth embodiment. The drive circuit 600 has a configuration in which the AC voltage signal source is provided with a phase adjustment function, instead of a phase adjuster. Specifically, the drive circuit 600 has a configuration in which the phase adjuster 6 is eliminated from the drive circuit 100 and the AC voltage signal source 1 is replaced by an AC voltage signal source 10.

The AC voltage signal source 10 outputs an AC signal V12 (which is also referred to as a first AC signal) to the voltage-to-current converter circuit 2 and outputs an AC signal V11 (which is also referred to as a second AC signal) to the reference voltage generator circuit 3. The AC voltage signal source 10 includes a control circuit 11, digital-to-analog converters (DAC) 12 and 13, and low-pass filters (LPF) 14 and 15.

The control circuit 11 outputs a digital signal to the DAC 12 and 13 for controlling their operation. The DAC 12 and 13 convert the input digital signal into an analog signal and thereby output an AC voltage. The AC voltage output from the DAC 12 enters the LPF 14 where its high frequency component is eliminated and is then output as the AC signal V12. The AC voltage output from the DAC 13 enters the LPF 15 where its high frequency component is eliminated and is then output as the AC signal V11.

For example, if the control circuit 11 supplies the digital signal to the DAC 13 later than the digital signal supplied to the DAC 12, it is possible to delay the phase of the AC signal V11 compared with the AC signal V12. Further, if the control circuit 11 supplies the digital signal to the DAC 13 earlier than the digital signal supplied to the DAC 12, it is possible to advance the phase of the AC signal V11 compared with the AC signal V12.

Note that the AC voltage signal source 10 can be applied to the drive circuit according to the embodiments other than the drive circuit 100.

Thirteenth Embodiment

Figure 30:
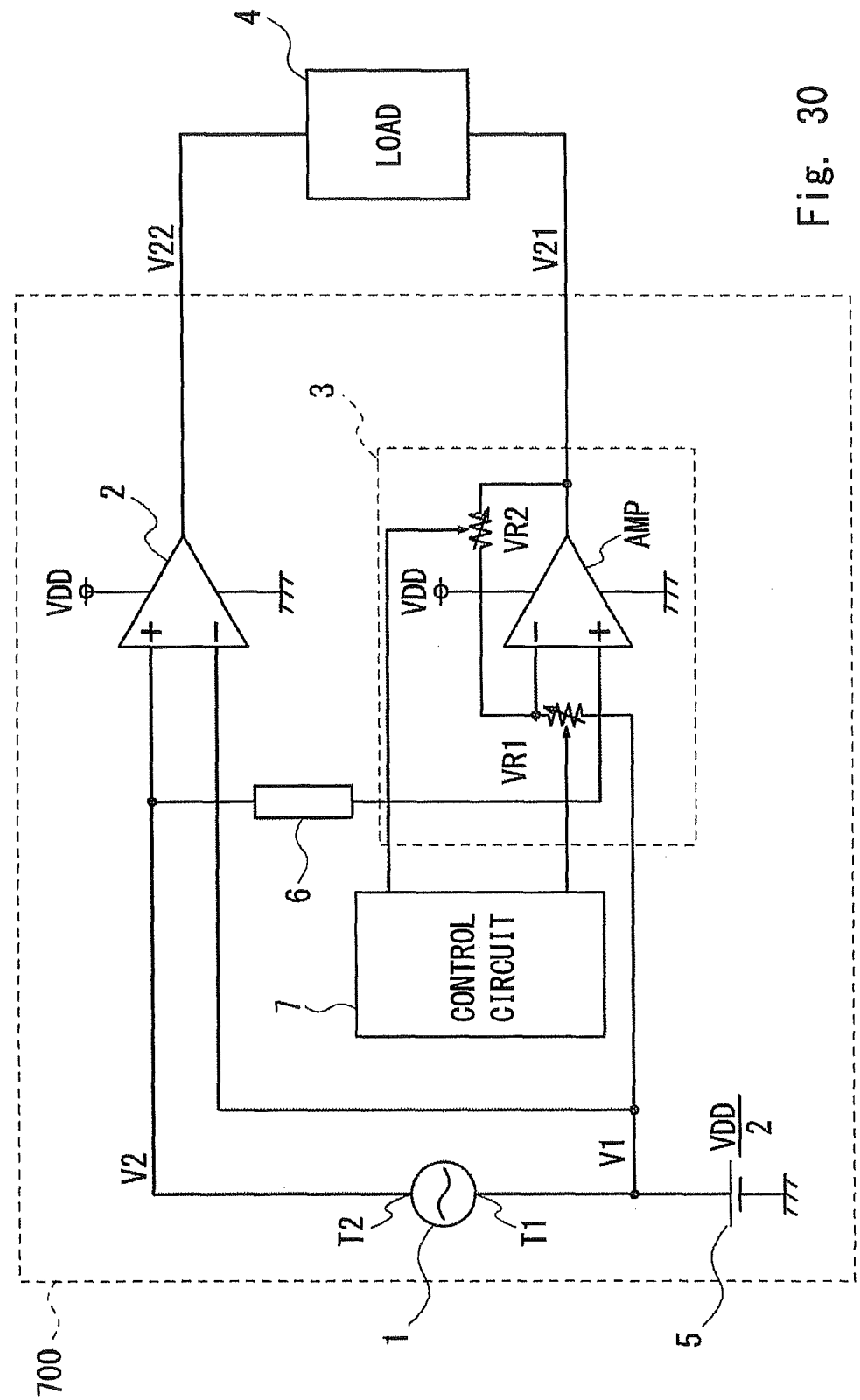
FIG. 30 is a circuit diagram showing a configuration of a drive circuit according to a thirteenth embodiment.

A drive circuit 700 according to a thirteenth embodiment is described hereinafter. FIG. 30 is a circuit diagram showing a configuration of the drive circuit 700 according to the thirteenth embodiment. The drive circuit 700 has a configuration in which the resistors R1 and R2 in the reference voltage generator circuit 3 of the drive circuit 100 are replaced by variable resistors VR1 and VR2 and further a control circuit 7 is added. The control circuit 7 is composed of a digital circuit, for example, and can control the resistances of the variable resistors VR1 and VR2. The other configuration of the drive circuit 700 is the same as that of the drive circuit 100 and thus not redundantly described.

Hereinafter, the resistances of the variable resistors VR1 and VR2 are denoted by R3 and R4, respectively. In this case, the reference voltage V21 is represented by the following equation (6), which is a modification of the equation (1).

[Equation 6]

$$V21 = -\frac{R4}{R3} \cdot A \cdot \sin(2\pi f t) + 1.2 \tag{6}$$

In the drive circuit 700, it is possible to control the amplitude of the reference voltage V21 by controlling the resistances of the variable resistors VR1 and VR2 as represented by the equation (6). By controlling the amplitude of the reference voltage V21, the amplitude of the output voltage V22 can be controlled in the same manner.

As described above, according to this configuration, by appropriately controlling the amplitude of the reference voltage V21 and the output voltage V22 as initial setting after connecting the load 4, it is possible to supply a current with a desired amplitude to the load 4.

Fourteenth Embodiment

Figure 31:
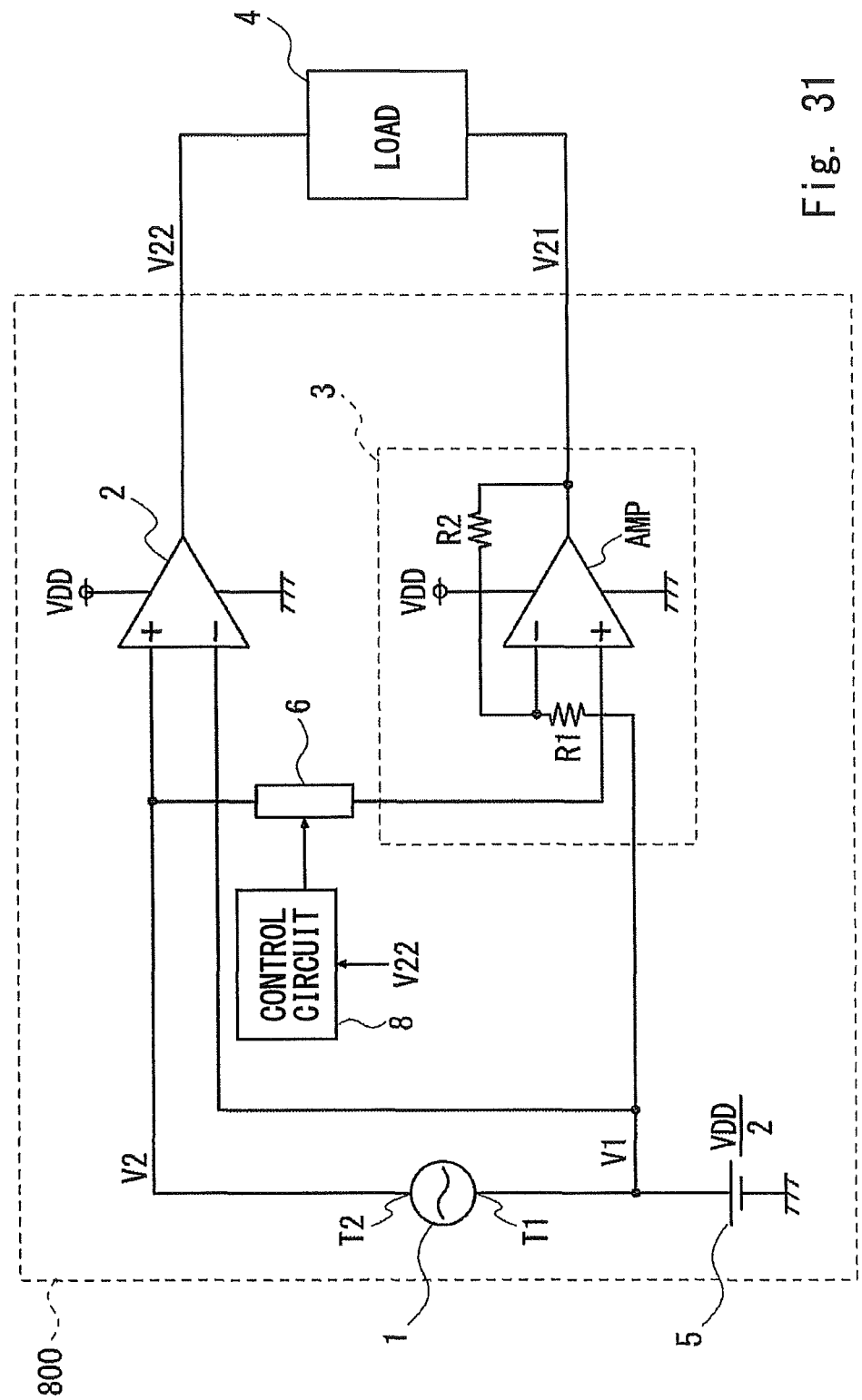
FIG. 31 is a circuit diagram showing a configuration of a drive circuit according to a fourteenth embodiment.

A drive circuit 800 according to a fourteenth embodiment is described hereinafter. FIG. 31 is a circuit diagram showing a configuration of the drive circuit 800 according to the fourteenth embodiment. The drive circuit 800 has a configuration in which a control circuit 8 is added to the drive circuit 100. The control circuit 8 controls the phase adjustment amount of the phase adjuster 6 in the reference voltage generator circuit 3. The control circuit 8 monitors the output voltage V22, for example, and outputs a control signal indicating the phase adjustment amount to the phase adjuster 6 according to a monitoring result.

As described above, according to this configuration, by appropriately controlling the phase adjustment amount of the phase adjuster 6 as initial setting after connecting the load 4, it is possible to control the reference voltage V21 to be in opposite phase to the output voltage V22.

Fifteenth Embodiment

Figure 32:
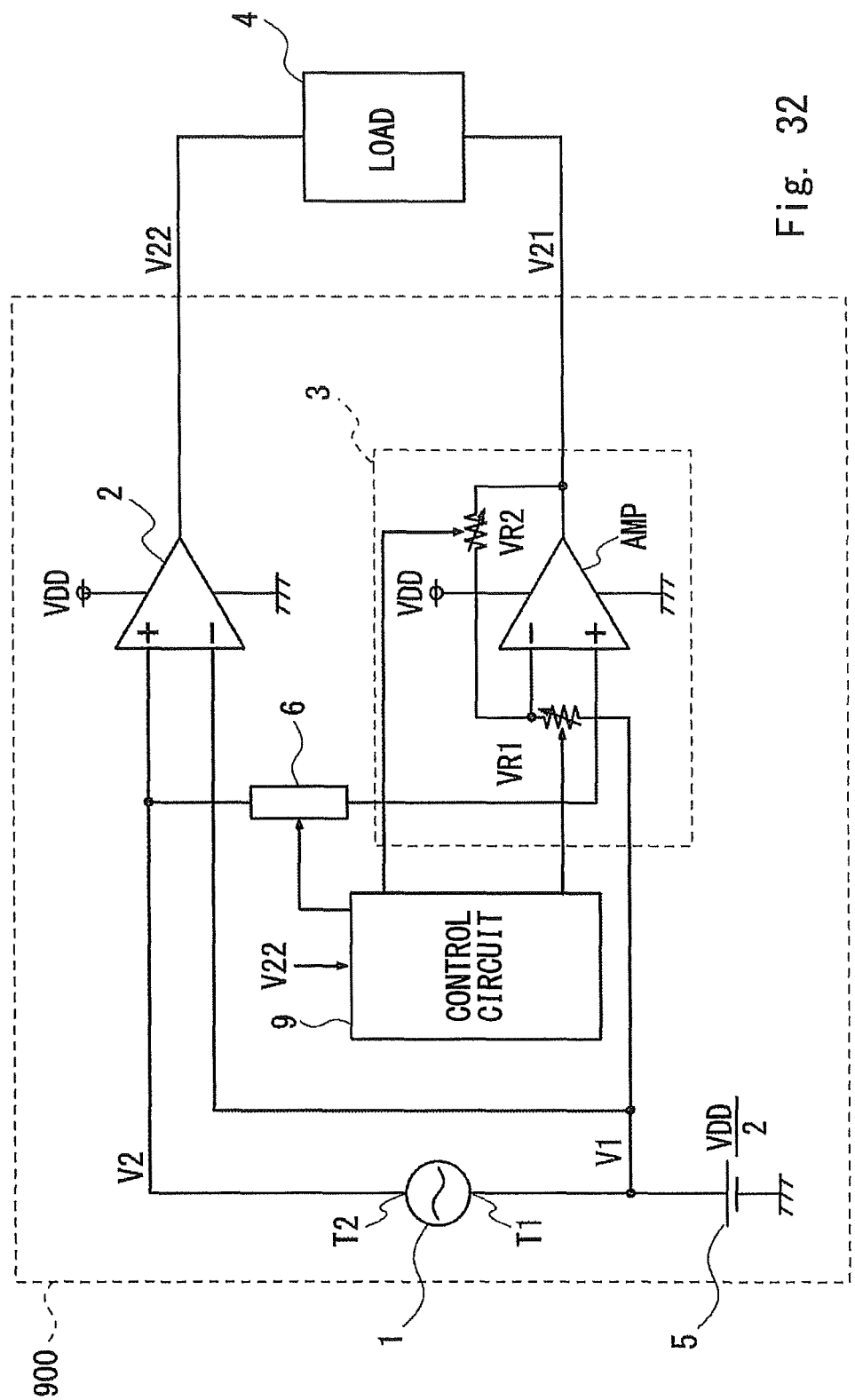
FIG. 32 is a circuit diagram showing a configuration of a drive circuit according to a fifteenth embodiment.

A drive circuit 900 according to a fifteenth embodiment is described hereinafter. FIG. 32 is a circuit diagram showing a configuration of the drive circuit 900 according to the fifteenth embodiment. The drive circuit 900 is a modified example of the drive circuit 700 and has a configuration in which the control circuit 7 is replaced by a control circuit 9. The control circuit 9 performs not only control of the resistances of the variable resistors VR1 and VR2 but also control of the phase adjustment amount of the phase adjuster 6 just like the control circuit 8.

As described above, according to this configuration, by appropriately controlling the amplitude of the reference voltage V21 and the output voltage V22 as initial setting after connecting the load 4, it is possible to supply a current with a desired amplitude to the load 4. In addition, by appropriately controlling the phase adjustment amount of the phase adjuster 6 as initial setting after connecting the load 4, it is possible to control the reference voltage V21 to be in opposite phase to the output voltage V22.

The present invention is not limited to the above-described embodiments, and various changes and modifications may be made without departing from the scope of the invention. For example, the above-described phase adjusters 61, 62, 69 and 70 can be applied to the drive circuit according to the above-described embodiments other than the drive circuit 200. The above-described phase adjusters 67 and 68 can be applied to the drive circuit according to the above-described embodiments other than the drive circuit 100.

Although the drive circuits according to the above-described embodiments 12 and 14 are described as modified examples of the drive circuit 100, they may be configured as modified examples of the drive circuit according to the above-described embodiments other than the drive circuit 100. Although the drive circuits according to the above-described embodiments 13 and 15 are described as modified examples of the drive circuit 100, they may be configured as modified examples of the drive circuit 200 according to the embodiment.

As the load 4, various types of loads that require an AC current such as a living body for bioelectrical impedance measurement or a display panel may be used.

Although embodiments of the present invention are described specifically in the foregoing, the present invention is not restricted to the above-described embodiments, and various changes and modifications may be made without departing from the scope of the invention.

The above-described embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A drive circuit comprising:
    a signal source that outputs an AC signal;
    a voltage generator circuit that includes a first differential amplifier that generates a first AC voltage corresponding to the AC signal and outputs the first AC voltage to one end of an external load; and
    a voltage-to-current converter circuit that supplies an AC current corresponding to the first AC voltage in opposite phase to another end of the external load,
    wherein the voltage generator circuit includes
        a first resistor, the specified voltage being applied to one end of the first resistor and another end of the first resistor being coupled to an inverting input terminal of the differential amplifier, and
        a second resistor, one end of the second resistor being coupled to the inverting input terminal of the first differential amplifier and another end of the second resistor being coupled to an output terminal of the first differential amplifier,
    wherein the AC signal is input to a non-inverting input terminal of the first differential amplifier, and
    wherein the first AC voltage is output from the output terminal of the first differential amplifier.

2. The drive circuit according to claim 1, wherein the AC signal is a positive voltage varying with a constant amplitude with reference to a specified voltage.

3. The drive circuit according to claim 2, wherein the voltage-to-current conversion circuit include a second differential amplifier whose output terminal is not connected to an input terminal of the second differential amplifier.

4. The drive circuit according to claim 3, wherein one or both of the first resistor and the second resistor is a variable resistor, and
the drive circuit further comprises a control circuit that controls a resistance of one or both of the first resistor and the second resistor.

5. The drive circuit according to claim 1, further comprising:
    a phase adjuster that is placed between the signal source and the voltage-to-current converter circuit or between the signal source and the voltage generator circuit, and adjusts a phase of the AC signal.

6. The drive circuit according to claim 1, wherein the voltage-to-current converter circuit outputs the AC current that is dependent on the first AC voltage received as input by the voltage-to-current converter circuit.

* * * * *